United States Patent
Hirose et al.

(10) Patent No.: US 8,693,516 B2
(45) Date of Patent: Apr. 8, 2014

(54) SEMICONDUCTOR SURFACE LIGHT-EMITTING ELEMENT AND METHOD OF MANUFACTURING THEREOF

(75) Inventors: Kazuyoshi Hirose, Hamamatsu (JP);
Shinichi Furuta, Hamamatsu (JP);
Akiyoshi Watanabe, Hamamatsu (JP);
Takahiro Sugiyama, Hamamatsu (JP);
Kousuke Shibata, Hamamatsu (JP);
Yoshitaka Kurosaka, Hamamatsu (JP);
Susumu Noda, Kyoto (JP)

(73) Assignees: Hamamatsu Photonics K.K., Hamamatsu-shi, Shizuoka (JP); Kyoto University, Kyoto-shi, Kyoto (JP)

(*) Notice: Subject to any disclaimer, the term of this patent is extended or adjusted under 35 U.S.C. 154(b) by 0 days.

(21) Appl. No.: 13/812,561

(22) PCT Filed: Jun. 21, 2011

(86) PCT No.: PCT/JP2011/064181
§ 371 (c)(1),
(2), (4) Date: Jan. 28, 2013

(87) PCT Pub. No.: WO2012/014604
PCT Pub. Date: Feb. 2, 2012

(65) Prior Publication Data
US 2013/0121358 A1    May 16, 2013

(30) Foreign Application Priority Data
Jul. 30, 2010 (JP) .................................. 2010-172578

(51) Int. Cl.
*H01S 5/183* (2006.01)

(52) U.S. Cl.
USPC ................ 372/50.124; 372/44.01; 372/45.01; 372/50.11

(58) Field of Classification Search
USPC ..................................................... 372/50.124
See application file for complete search history.

(56) References Cited

U.S. PATENT DOCUMENTS

| | | | |
|---|---|---|---|
| 2001/0019848 A1* | 9/2001 | Misewich et al. | 438/2 |
| 2007/0014324 A1* | 1/2007 | Maeda et al. | 372/46.01 |
| 2007/0030873 A1* | 2/2007 | Deng | 372/50.11 |
| 2007/0217466 A1* | 9/2007 | Noda et al. | 372/50.11 |

FOREIGN PATENT DOCUMENTS

| | | |
|---|---|---|
| JP | 2006-156944 | 6/2006 |
| JP | 2006-258865 | 9/2006 |
| JP | 2008-506269 | 2/2008 |
| JP | 2009-206157 | 9/2009 |
| JP | 2010-114384 | 5/2010 |

* cited by examiner

*Primary Examiner* — Xinning Niu
(74) *Attorney, Agent, or Firm* — Drinker Biddle & Reath LLP

(57) ABSTRACT

A semiconductor surface light-emitting element of this invention is provided with a photonic crystal layer 6 obtained by periodically forming a plurality of holes H in a basic layer 6A comprised of a first compound semiconductor of the zinc blend structure and growing embedded regions 6B comprised of a second compound semiconductor of the zinc blend structure, in the holes H, and an active layer 4 to supply light to the photonic crystal layer 6, in which a principal surface of the basic layer 6A is a (001) plane and in which side faces of each hole H have at least three different {100} facets.

8 Claims, 30 Drawing Sheets

(A)

[110] ↑
→ [1-10]

(B) DIRECTION PARALLEL TO ORIENTATION FLAT (C) DIRECTION NORMAL TO ORIENTATION FLAT (D)

(E)

(A)

[110]
[1-10]

(B) DIRECTION PARALLEL TO ORIENTATION FLAT (C) DIRECTION NORMAL TO ORIENTATION FLAT (D)

(E)

[110]
[1-10]

(A)

(B)

SEMICONDUCTOR SURFACE LIGHT-EMITTING ELEMENT AND METHOD OF MANUFACTURING THEREOF

TECHNICAL FIELD

An aspect of the present invention relates to a semiconductor surface light-emitting element and a manufacturing method thereof.

BACKGROUND ART

A photonic crystal is a nanostructure in which the refractive index varies on a periodic basis, and can control wavelengths of light passing through it. A photonic crystal surface light-emitting laser (referred to hereinafter as PCSEL) using a two-dimensional photonic crystal (referred to hereinafter as 2DPC) is proposed as a next-generation semiconductor surface light-emitting element. PCSEL is characterized in that the optical properties thereof are determined by the size and shape of microstructure, independent of materials, and has new properties hard to be achieved by the conventional semiconductor light-emitting elements alone, such as large area and single mode, two-dimensional polarization control, and control of emission angle, leading to a potential to develop a probability of a high-output semiconductor laser.

Practical fabrication of 2DPC employs the wafer bonding technology and has the following problems (1) to (3). (1) It is difficult to produce a large-area 2DPC. Specifically, for example, when wafers to be bonded are warped, when there is dust between wafers, or when wafer surfaces are significantly uneven, these wafers cannot be well bonded to each other. (2) The 2DPC layer includes cavities and the coupling coefficient K is large, which is not suitable for implementation of large area. The reason for it is as follows: in order to distribute light uniformly over the 2DPC layer, it is desirable to set the normalized coupling coefficient KL in in-plane directions relative to the electrode length L in the range of about 1 to 2, but in the case where the 2DPC layer includes cavities, the value of K becomes not less than 1000 cm$^{-1}$ and the value of L is thus limited to several ten μm. (3) There are defects formed at the interface between the bonded wafers, which leads 10 to drawbacks in lifetime and reliability.

A regrowth type PCSEL using regrowth of crystal is offered as 2DPC fabrication means to solve the above problems, and this has the following advantages. (1) It is easy to fabricate a large-area 2DPC. Namely, the use of regrowth eliminates the need for bonding crystals. (2) When the 2DPC layer is perfectly embedded, the coupling coefficient κ thereof becomes reduced to about ⅒ of the coupling coefficient in the case of the wafers being bonded, which facilitates implementation of large area. (3) The interface of the 2DPC layer is embedded by epitaxial layer, which decreases defects and improves reliability. (4) Since the 2DPC layer includes no cavities, it is excellent in heat radiation and is suitable for increase of power.

From the above-described viewpoints, the regrowth type PCSEL is superior to the bonded type PCSEL, in terms of aiming at practical use of high-output PCSEL.

Patent Literature 1 describes a proposal of embedding hexagonal projections in a semiconductor layer, as photonic crystals without cavities in the regrowth of crystal. In this case, with respect to the principal surfaces of (0001) plane of the projections, the side faces are comprised of (1-100) facets.

Patent Literature 2 describes execution of regrowth embedding in crystal growth of the zinc blende structure using a (111) substrate with a polar plane or a (n11) substrate (preferably, 2≤n≤6) with a semipolar plane, and uses lateral growth as means thereof.

CITATION LIST

Patent Literatures

Patent Literature 1: Japanese Patent Application Laid-open No. 2009-206157
Patent Literature 2: Japanese Patent Application Laid-open No. 2010-114384

SUMMARY OF INVENTION

Technical Problem

However, when the inventors conducted an experiment of forming holes in a semiconductor layer of the zinc blende structure and carrying out regrowth of crystal in the holes, we discovered that the surface morphology of a compound semiconductor surface formed thereon was not good and there were large dislocations generated inside the crystal. Namely, the crystallinity of the formed semiconductor layer is insufficient and thus the properties of the semiconductor surface light-emitting element are not satisfactory.

The present invention has been accomplished in view of this problem and it is an object of the present invention to provide a semiconductor surface light-emitting element and a manufacturing method thereof capable of achieving improvement in properties.

Solution to Problem

In order to solve the above problem, a semiconductor surface light-emitting element according to an aspect of the present invention comprises: a photonic crystal layer comprising: a basic layer including a plurality of holes periodically arranged in the basic layer, the basic layer being comprised of a first compound semiconductor of zinc blende structure, and an embedded regions comprised of a second compound semiconductor of zinc blende structure, the embedded regions being grown in the holes; and an active layer for supplying light to the photonic crystal layer, wherein a principal surface of the basic layer is a (001) plane, and wherein side faces of the holes include at least three different {100} facets, or facets resulting from rotation of said {100} facets at a rotation angle of less than ±35° around a normal line to the principal surface.

We found the following fact: when the side faces of the holes are comprised of four different {110} facets, (110) and (-1-10) facets appear in the embedded regions grown normally to the side faces of (110) and (-1-10) facets, and when these facets come to contact in the central region, crystals become disordered to degrade the final crystallinity. Namely, the surface morphology of a semiconductor layer formed on the photonic crystal layer becomes rough, and there are many dislocations generated inside. When the side faces of the holes include (110) and (-1-10) facets, a plurality of facets compete on facets appearing at an initial stage of the regrowth embedding process (e.g., (113) and (-1-13), i.e., (113)A facets), resulting in heterogeneous regrowth in part. There is also a mechanism in which this region serves as nuclei for formation of dislocations.

On the other hand, when the shape of the side faces of the holes is that in one aspect of the present invention, the surface morphology of the semiconductor layer formed on the photonic crystal layer is very good and has high flatness, confirming that an amount of dislocations generated inside is relatively reduced. Since such improvement in crystallinity of the semiconductor layer enhances resistance to temperature or heat, the lifetime increases and, leak current and internal resistance become lowered, so as to improve luminous efficiency. Namely, the properties of the semiconductor surface light-emitting element are improved when the shape of the holes is the one in the present invention.

The element is characterized in that the side faces of the holes include four different {100} facets, or facets resulting from rotation of these {100} facets at a rotation angle of less than ±35° around the normal line to the principal surface.

In the case of one aspect of the present invention, the surface morphology of the semiconductor layer formed on the photonic crystal layer is very good and has high flatness, whereby the properties of the semiconductor surface light-emitting element are improved in the same manner as above.

The element is characterized in that the rotation angle is set to not more than ±25°. When the rotation angle is not more than ±25°, the surface morphology is more improved than in the case of 35°, so as to improve the crystallinity of the semiconductor layer.

The element is characterized in that the rotation angle is set to not more than ±20°. When the rotation angle is not more than +20°, the surface morphology is much more improved than in the case of 25°, so as to improve the crystallinity of the semiconductor layer.

The first compound semiconductor is GaAs and the second compound semiconductor AlGaAs. When these compound semiconductors of the zinc blende structure are employed, their material properties are well known and thus formation thereof is easy.

A manufacturing method of semiconductor surface light-emitting element to manufacture the aforementioned semiconductor surface light-emitting element is characterized by comprising a step of forming the holes, and a step of carrying out growth of the embedded regions. The method may include a step of forming an alignment mark including {110} facets, or facets resulting from rotation of {110} at a rotation angle of within ±10° around the normal line to the principal surface, on a semiconductor substrate on which the basic layer is formed, by etching, prior to the step of carrying out the growth. In this method, when the aforementioned element is formed, dislocations are formed in a regrown layer of the alignment mark to roughen a regrown surface, which can be used as a reference position in optical exposure.

Advantageous Effect of Invention

With the semiconductor surface light-emitting element and manufacturing method thereof according to one aspect of the present invention, the crystallinity of the semiconductor layer forming it is improved and it is thus feasible to improve the properties such as emission output and lifetime.

DESCRIPTION OF EMBODIMENTS

A semiconductor surface light-emitting element and manufacturing method thereof according to an embodiment will be described below. The same elements will be denoted by the same reference signs, without redundant description.

Figure 1:
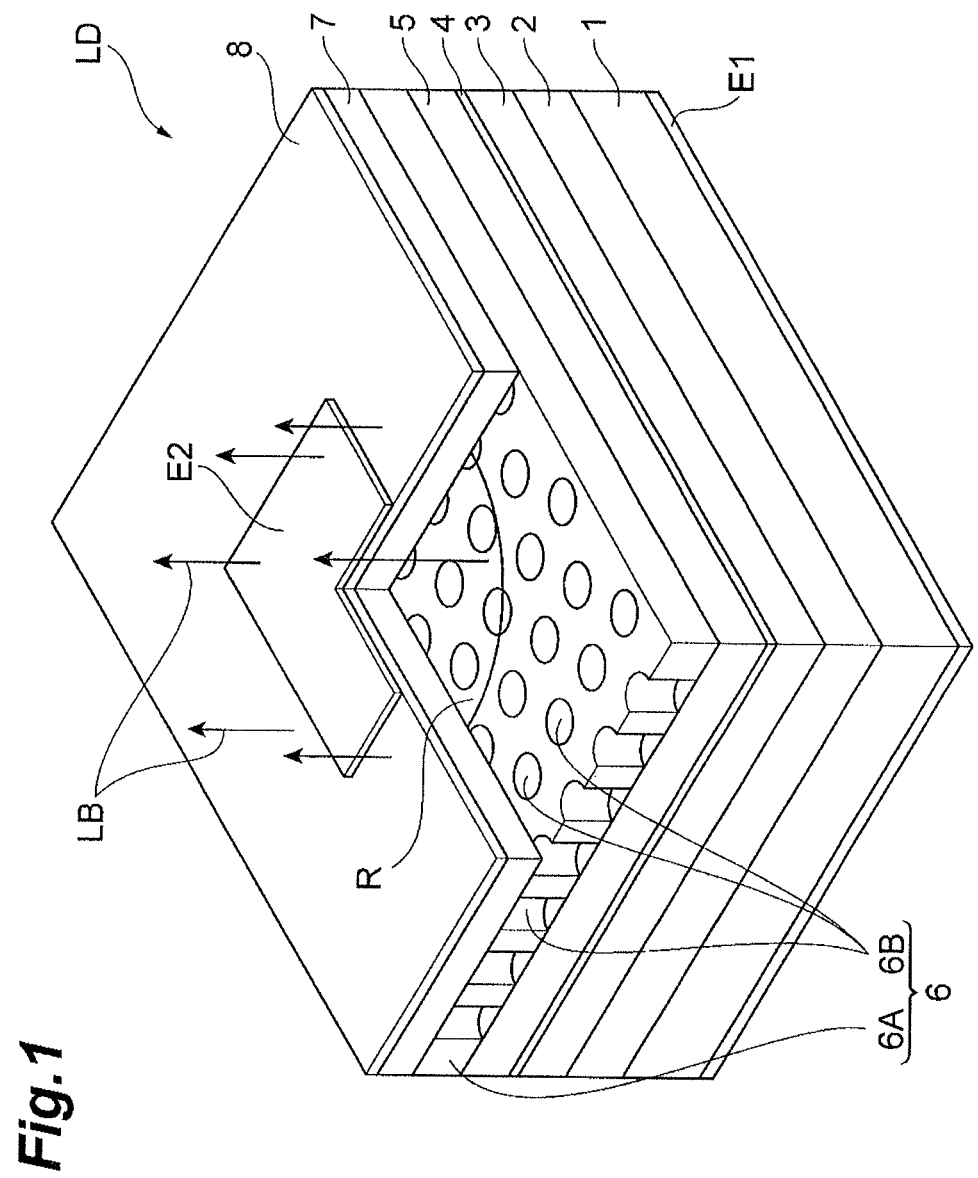
FIG. 1 is a perspective view of a semiconductor surface light-emitting element as a partly broken view of the semiconductor surface light-emitting element.

FIG. 1 is a perspective view of the semiconductor surface light-emitting element a part of which is broken.

The semiconductor surface light-emitting element is provided with a lower cladding layer 2, a lower light guiding layer 3, an active layer 4, an upper light guiding layer 5, a photonic crystal layer 6, an upper cladding layer 7, and a contact layer 8 which are successively formed on a semiconductor substrate 1. An electrode E1 is provided over the entire surface on the back side of the semiconductor substrate 1, and an electrode E2 in a central region of the contact layer 8.

Materials/thicknesses of these compound semiconductor layers are as described below. The layers without conductivity type are intrinsic semiconductors an impurity concentration of which is not more than $10^{15}/cm^3$. When the layers are doped with an impurity, concentrations thereof are in the range of $10^{17}$ to $10^{20}/cm^3$. The below shows an example in the present embodiment, and there are some degrees of freedom for material systems, thicknesses, and structure of layers as long as the element has the configuration including the active layer 4 and the photonic crystal layer 6. Numerals in parentheses are numerical values used in below-described experiments, the growth temperature of AlGaAs by MOCVD is from 500° C. to 850° C., that employed in the experiments was from 550 to 700° C., an Al source material used in growth was TMA (trimethylaluminum), a gallium source material TMG (trimethylgallium) and TEG (triethylgallium), an As source material $AsH_3$ (arsine), a source material for n-type impurity $Si_2H_6$ (disilane), and a source material for p-type impurity DEZn (diethyl zinc).

Contact Layer 8:
p-type GaAs/50-500 nm (200 nm)
Upper Cladding Layer 7:
p-type AlGaAs ($Al_{0.4}Ga_{0.6}As$)/1.0-3.0 μm (2.0 μm)
Photonic Crystal Layer 6:
basic layer 6A: GaAs/50-200 nm (100 nm)
embedded regions 6B: AlGaAs ($Al_{0.4}Ga_{0.6}As$)/50-200 nm (100 nm)
Upper Light Guiding Layer 5:
upper layer: GaAs/10-200 nm (50 nm)
lower layer: p-type or intrinsic AlGaAs/10-100 nm (50 nm)
Active Layer 4 (Multiple Quantum Well Structure):
AlGaAs/InGaAs MQW/10-100 nm (30 nm)
Lower Light Guiding Layer 3:
AlGaAs/0-300 nm (150 nm)
Lower Cladding Layer 2:
n-type AlGaAs/1.0-3.0 μm (2.0 μm)
Semiconductor Substrate 1:
n-type GaAs/80-350 μm (200 μm)

When an electric current is allowed to flow between the upper and lower electrodes E1, E2, the electric current flows through a region R immediately below the electrode E2 and this region emits light, whereby a laser beam LB is output in a direction normal to the substrate.

Figure 2:
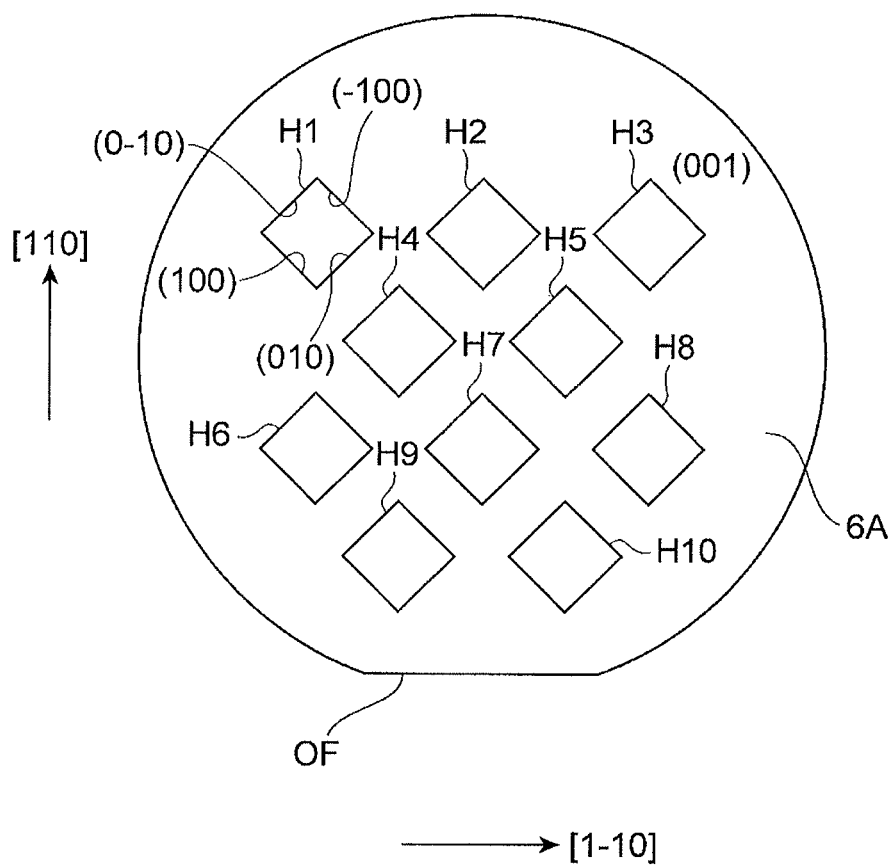
FIG. 2 is a plan view of a basic layer 6A formed on a wafer.
Figure 3:
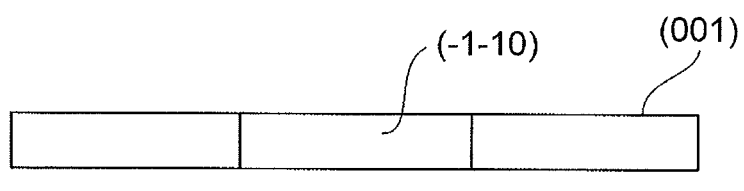
FIG. 3 is a front elevation of the wafer.
Figure 3:
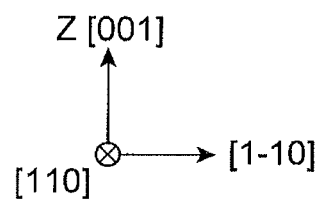

FIG. 2 is a plan view of the basic layer 6A formed on a wafer. In the plan view, for clear understanding, a plurality of holes H are illustrated in a scale much larger than an actual scale and the number thereof is smaller than the actual number. FIG. 3 is a front elevation of the wafer.

The principal surface of the wafer (substrate) is the (001) plane and the same drawing shows a state in which the principal surface (001) of the basic layer 6A is exposed in the surface. The a-axis, b-axis, and c-axis of the crystal of the zinc blende structure are shown as X-axis, Y-axis, and Z-axis, respectively, in the drawing. The directions of the X-axis, Y-axis, and Z-axis are [100], [010], and [001], respectively.

An orientation flat (which will be referred to hereinafter as ori-fla) OF is formed at one end of the wafer and the ori-fla OF is normal to the [110] direction. The ori-fla OF has a (-1-10) facet. A plurality of holes H (H1 to H10) are formed in the basic layer 6A and each of the holes H has a depth in a thickness direction of the semiconductor substrate.

The contour in the planar shape of each hole H is a rectangle, and each side of the rectangle is inclined at 45° relative to the extending direction [1-10] of the ori-fla OF. Namely, the four side faces of each hole H have a (100) facet, a (0-10) facet, a (−100) facet, and a (010) facet, respectively. These facets can be represented by {100} facets, as crystallographically equivalent facets.

The positions of the gravity centers of the holes H in the plane are arranged at equal intervals along the [1-10] direction and also arranged at equal intervals along the [110] direction. The same drawing shows the configuration where the former intervals (e.g., the interval between H1 and H2) are smaller than the latter intervals (e.g., the interval between H1 and H6), but the present invention does not have to be limited to this configuration. The holes are arranged so that another hole H4 is located on an extension along the [110] direction from a midpoint position of the former interval (e.g., that between H1 and H2).

The intervals in the [1-10] direction of the gravity centers of the holes H in the embodiment are 330 nm and the intervals in the [110] direction thereof are 570 nm. The shape of the holes is the rectangle, the length of each side 165 nm, and the area $2.7 \times 10^4$ $nm^2$. A group of lines connecting the gravity center positions of the holes H can constitute a square grid, a rectangle grid, or a triangle grid, and may be a random arrangement.

Since the embedded regions or layer 6B shown in FIG. 1 are embedded inside the holes H in the basic layer 6A, the side faces thereof are in contact with the side faces of the holes H and plane orientations thereof agree with those of the side faces of the holes H.

As described above, the foregoing semiconductor surface light-emitting element has the photonic crystal layer 6 obtained by periodically forming the plurality of holes H in the basic layer 6A comprised of the first compound semiconductor (GaAs) of the zinc blende structure and growing the embedded regions 6B comprised of the second compound semiconductor (AlGaAs) of the zinc blende structure, in the holes H. Of course, the first compound semiconductor and the second compound semiconductor have their respective refractive indices different from each other in order to form the photonic crystal. In the description, an electron microscope used was a scanning electron microscope (SEM). Sectional SEM images were obtained by photographing cross sections, after stain-etched with ammonia-hydrogen peroxide mixture.

Figure 4:
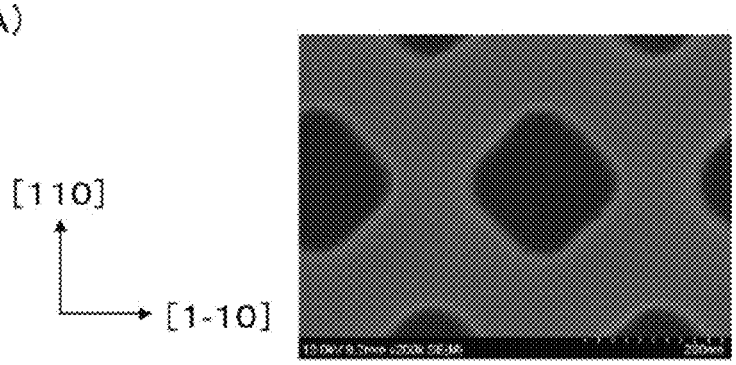
FIG. 4 is a drawing showing electron microscope photographs of the basic layer 6A with holes formed therein.
Figure 4:
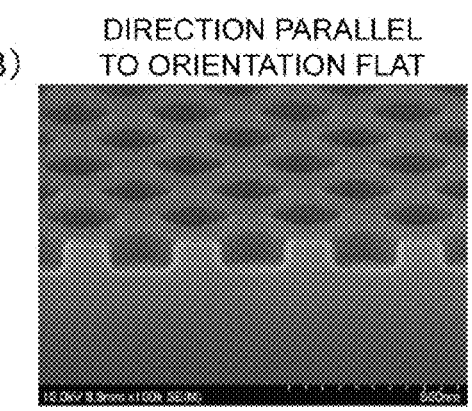
Figure 4:
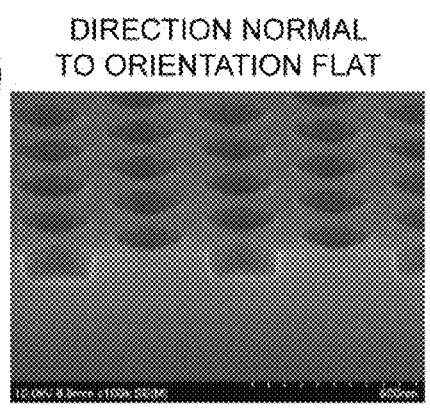
Figure 4:
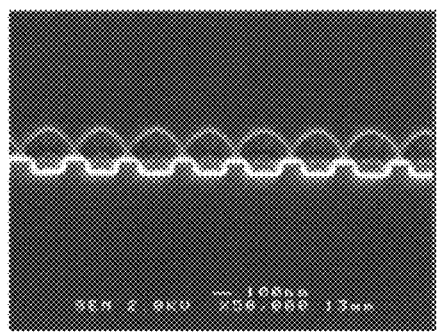
Figure 4:
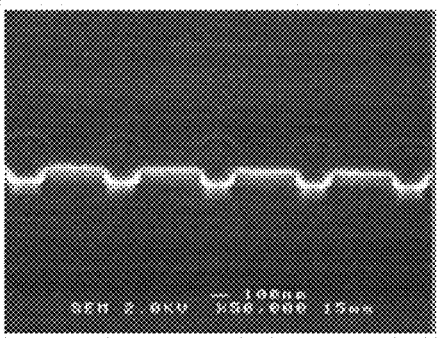

FIG. 4 is a drawing showing electron microscope photographs of the basic layer 6A with the holes formed therein.

FIG. 4(A) shows a planar photograph of the holes H and shows the square holes H. FIG. 4(B) shows a sectional image of the basic layer (before formation of the embedded regions) cut along a direction parallel to the ori-fla, and FIG. 4(C) a sectional image of the basic layer (before formation of the embedded regions) cut along a direction normal to the ori-fla. FIG. 4(D) shows a sectional image of the basic layer (after formation of the embedded regions) cut along the direction parallel to the ori-fla and FIG. 4(E) a sectional image of the basic layer (after formation of the embedded regions) cut along the direction normal to the ori-fla.

An embedding step is continued before formation of the upper cladding layer and thereafter, the contact layer is formed. There are no large dislocations observed in these embedded regions and upper cladding layer and it is seen that they have good crystallinity.

Figure 5:
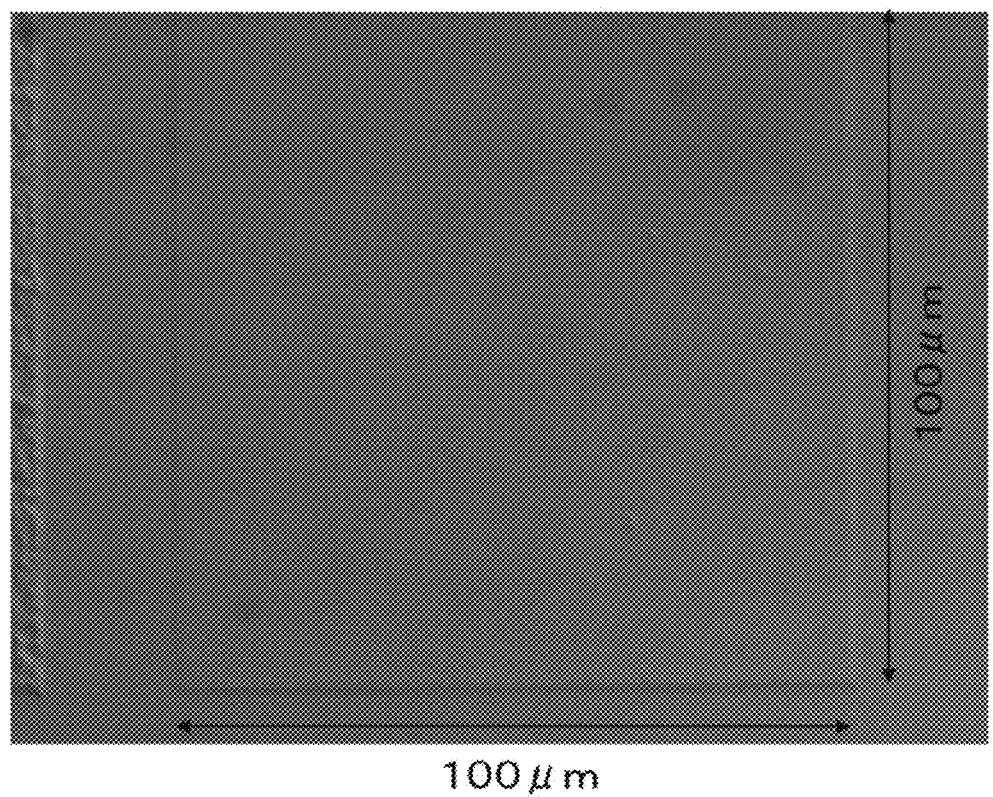
FIG. 5 is a drawing showing an optical microscope photograph of a surface of a semiconductor layer located on the outermost side of the semiconductor surface light-emitting element.
Figure 5:
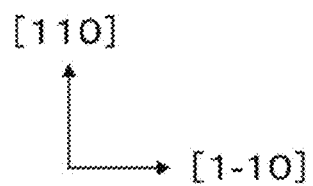

FIG. 5 is a drawing showing an optical microscope photograph of a surface of the semiconductor layer (contact layer) located on the outermost side of the semiconductor surface light-emitting element, in the case of FIG. 4. The surface of the contact layer is flat and has excellent morphology, with few irregularities observed. This indirectly indicates that the crystallinity is excellent inside.

Figure 6:
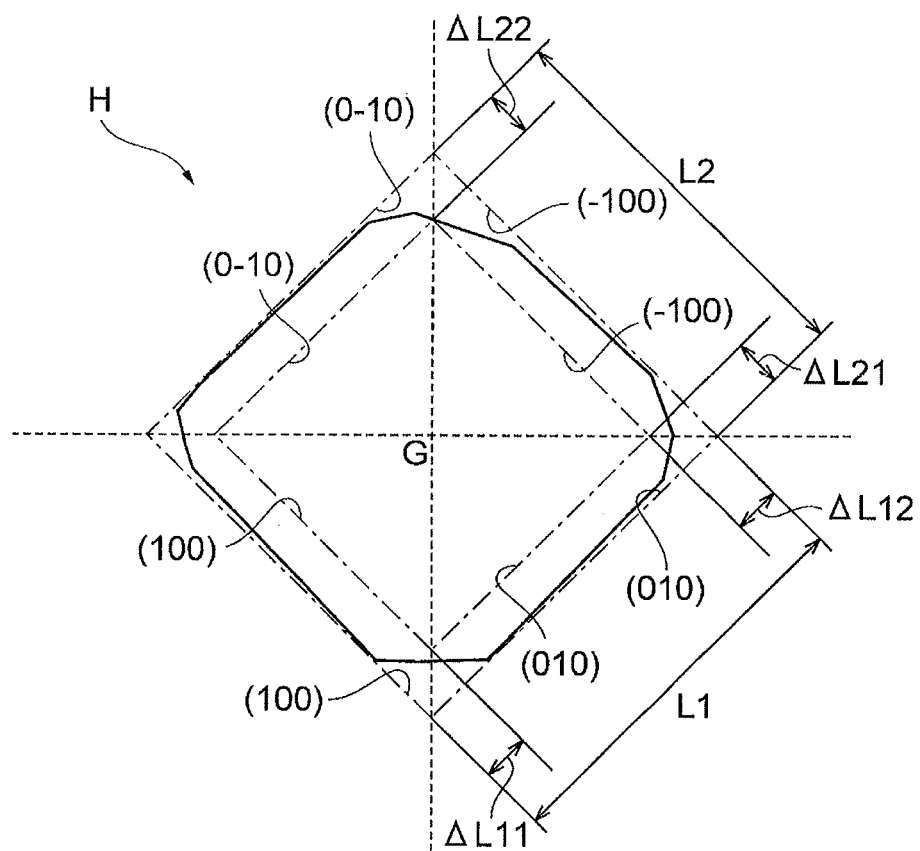
FIG. 6 is a drawing showing a detailed configuration of the shape of the hole.
Figure 6:
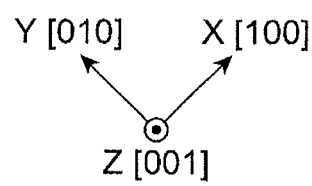

FIG. 6 is a drawing showing a detailed configuration of the shape 1.0 of the hole.

In the XY plane, L1 and L2 represent the lengths of respective sides of a rectangle circumscribed about the contour of the hole H. Let us assume an inscribed rectangle similar to the foregoing rectangle, with one corner in contact with the hole inside. The inscribed rectangle has the gravity center G in common with the circumscribed rectangle and their rotational positions in the XY plane are assumed to equal. In this case, the separation distances between corresponding sides are defined as $\Delta L11$, $\Delta L12$, $\Delta L21$, and $\Delta L22$.

When $(\Delta L11+\Delta L12)/L1$ is less than 29% and $(\Delta L21+\Delta L22)/L2$ is less than 29% and when a maximum of the area of the hole in the XY plane (the area of the outermost surface thereof) is not less than 50% of the area of the circumscribed rectangle, the shape of the hole is presumed as a rectangle and the side faces of the hole H are recognized as including four {100} facets.

Figure 7:
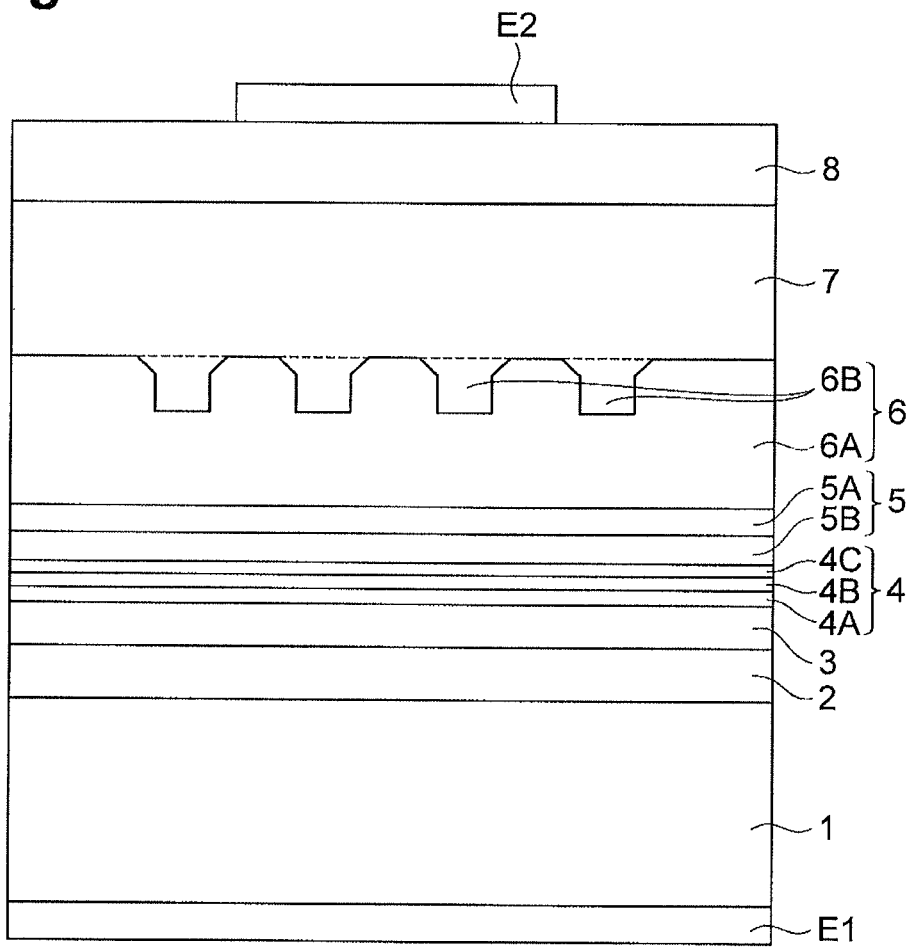
FIG. 7 is a cross-sectional view of the semiconductor surface light-emitting element.
Figure 7:
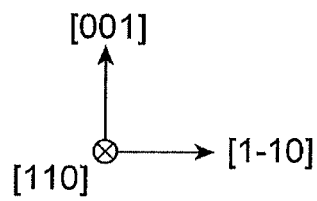

FIG. 7 is a sectional view of the semiconductor surface light-emitting element. This example shows a section parallel to the ori-fla.

As described above, the semiconductor surface light-emitting element is provided with the lower cladding layer 2, lower light guiding layer 3, active layer 4, upper light guiding layer 5, photonic crystal layer 6, upper cladding layer 7, and contact layer 8 successively formed on the semiconductor substrate 1. In this configuration, the active layer 4 is a layer to supply light to the photonic crystal layer 6, and has upper and lower semiconductor layers 4A, 4C and a center semiconductor layer 4B between them. The relationship of energy band gaps of these layers is the same as that in ordinary lasers, and is set to constitute the multiple quantum well structure with the QW (quantum well) layer of 4B in between the guiding layers of 4A, 4C. The photonic crystal layer 6 is used to generate a laser beam by resonance of light. Namely, this semiconductor surface light-emitting element is a photonic crystal surface light-emitting laser, but this structure without occurrence of lasing can also be used as a light-emitting diode.

Figure 8:
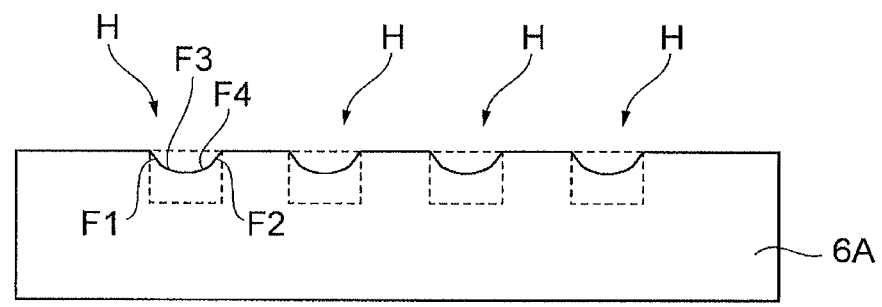
FIG. 8 is a cross-sectional view in a direction parallel to ori-fla of the basic layer 6A.
Figure 8:
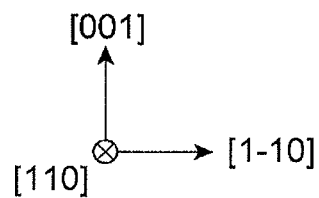
Figure 9:
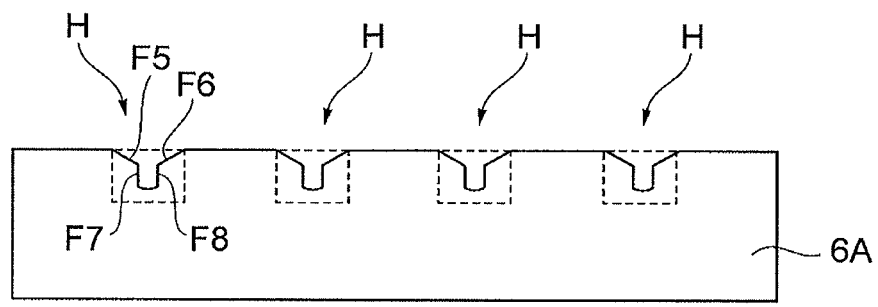
FIG. 9 is a cross-sectional view in a direction normal to ori-fla of the basic layer 6A.
Figure 9:
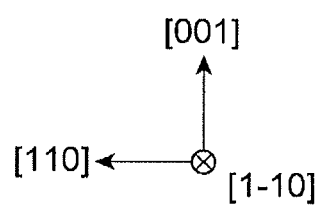

FIG. 8 is an example of the sectional shape of the basic layer 6A at an initial stage of regrowth embedding in the direction parallel to the ori-fla and FIG. 9 an example of the sectional shape of the basic layer 6A at the initial stage of regrowth embedding in the direction normal to the ori-fla. As shown in these drawings, each hole H has inclined facets (F1-F8) inclined relative to the {100} side faces. The plane orientations of the respective inclined facets F1-F8 are (1-11), (−111), (1-13), (−113), (-1-13), (113), (-1-10), and (110), respectively.

Figure 10:
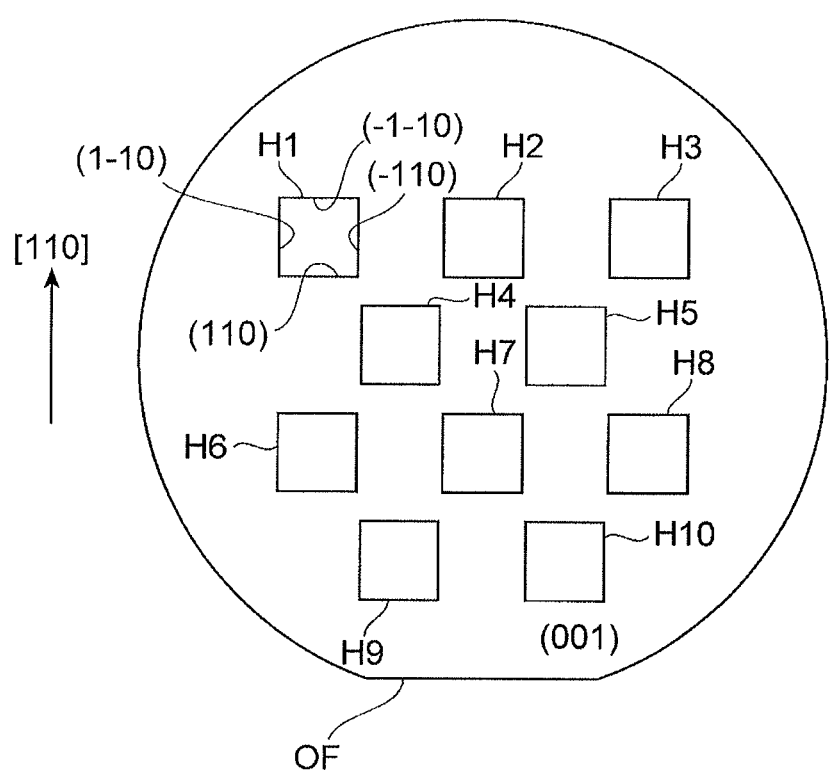
FIG. 10 is a plan view of the basic layer 6A formed on a wafer according to a first comparative example.

FIG. 10 is a plan view of the basic layer 6A formed on a wafer according to a first comparative example. When the semiconductor surface light-emitting element shown in FIGS. 1 to 9 is defined as an example, the element of the first comparative example is different only in the shape of the holes H from the example. Namely, the side faces of the holes H are comprised of {110} facets, respectively. In more detail, the side faces of each hole are (110), (1-10), (-1-10), and (−110) facets.

Figure 11:
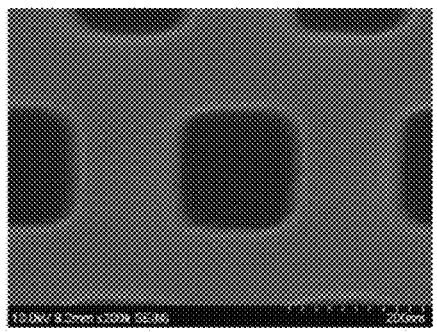
FIG. 11 is a drawing showing electron microscope photographs of the basic layer 6A with holes formed therein according to the first comparative example.
Figure 11:
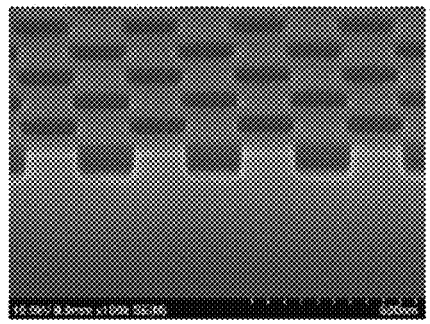
Figure 11:
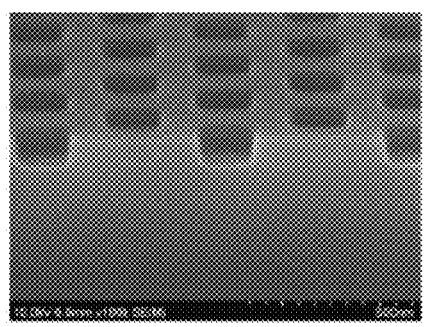
Figure 11:
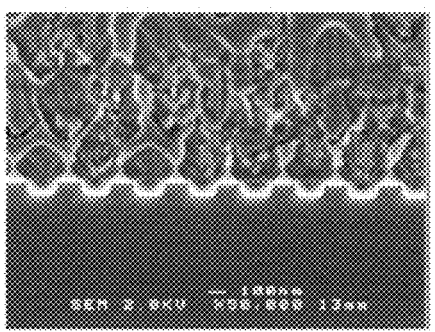
Figure 11:
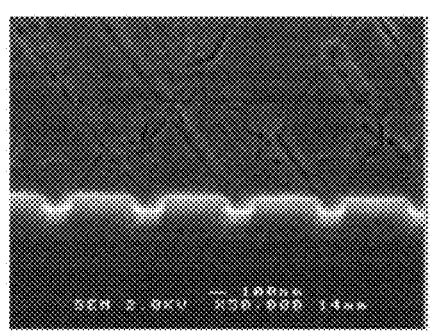

FIG. 11 is a drawing showing electron microscope photographs of the basic layer 6A with the holes according to the first comparative example formed therein.

FIG. 11(A) shows a planar photograph of the holes H and shows the square holes H. FIG. 11(B) shows a sectional image of the basic layer (before formation of the embedded regions) cut along the direction parallel to the ori-fla and FIG. 11(C) a sectional image of the basic layer (before formation of the embedded regions) cut along the direction normal to the ori-fla. FIG. 11(D) shows a sectional image of the basic layer (after formation of the embedded regions) cut along the direction parallel to the ori-fla and FIG. 11(E) the sectional image of the basic layer (after formation of the embedded regions) cut along the direction normal to the ori-fla.

The embedding step is continued before formation of the upper cladding layer and thereafter, the contact layer is formed. There are large dislocations observed in these embedded regions and upper cladding layer (cf. FIG. 11(D) and FIG. 11(E)), indicating that the crystallinity is not good.

Figure 12:
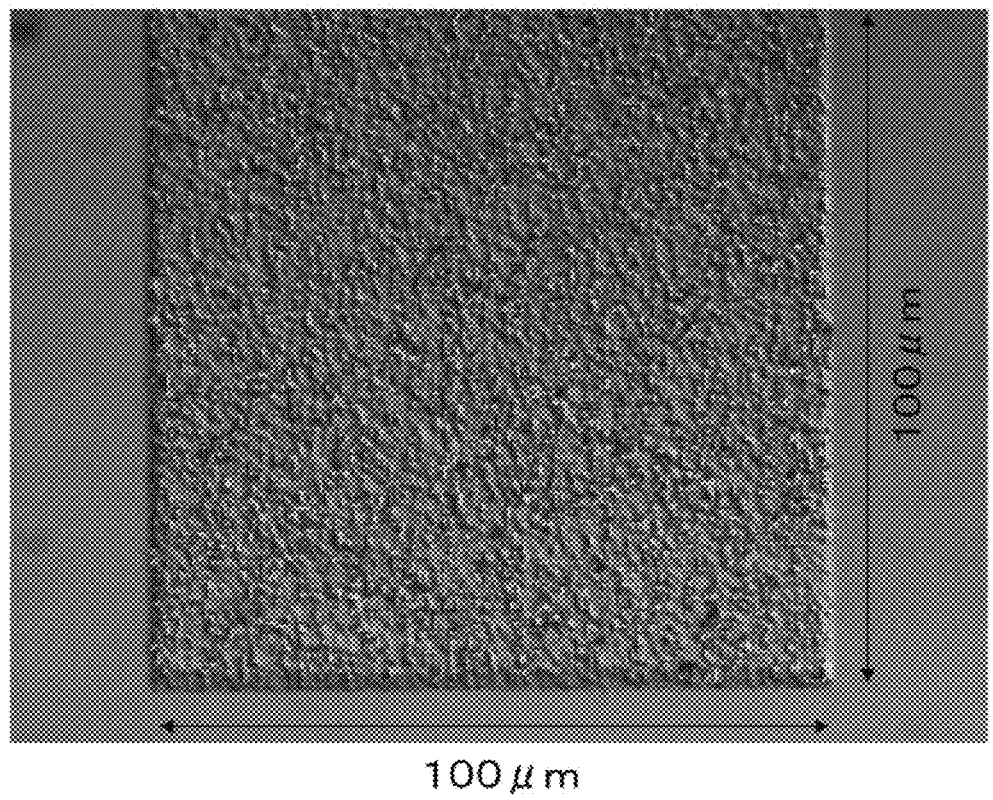
FIG. 12 is a drawing showing an optical microscope photograph of the surface of the semiconductor layer located on the outermost side of the semiconductor surface light-emitting element according to the first comparative example.

FIG. 12 is a drawing showing an optical microscope photograph of the surface of the semiconductor layer (contact layer) located on the outermost side of the semiconductor surface light-emitting element according to the first comparative example.

The surface of the contact layer is rough and has inferior morphology, with many irregularities observed. This indirectly indicates that the crystallinity is inferior inside.

As described above, it was found that the crystallinity was low when the side faces of the holes were comprised of four different {110} facets. Let us consider the principle of this result.

Figure 13:
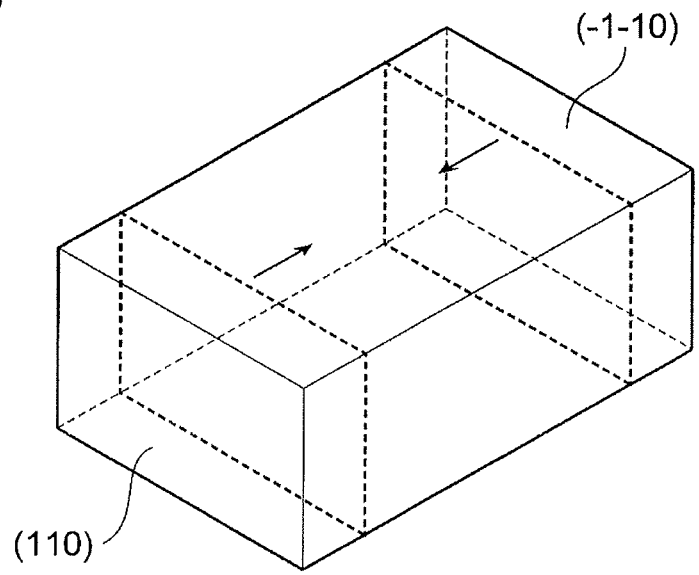
FIG. 13 is a drawing showing a concept of degradation of crystallinity.
Figure 13:
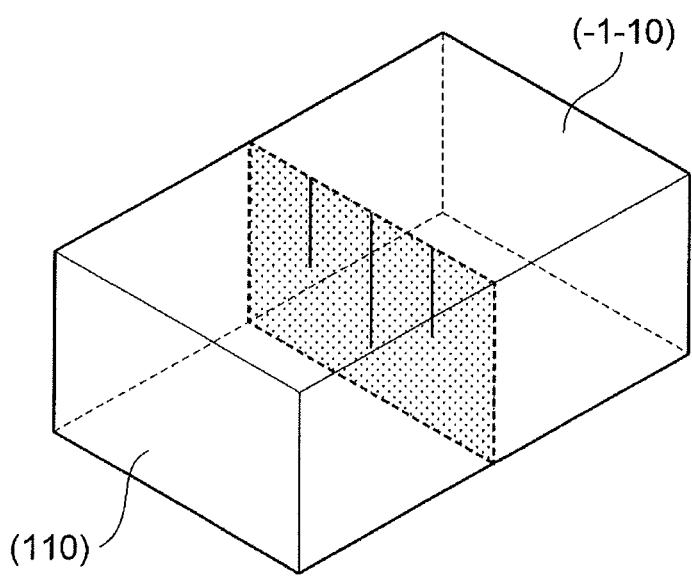

FIG. 13 is a drawing showing a concept of degradation of crystallinity.

It was found in the first comparative example that (A) the (110) and (-1-10) facets emerged in the embedded regions grown normally to the side faces of (110) and (-1-10) and (13) the crystals were disordered upon contact of these facets in the central region with the development of crystal growth, eventually resulting in degradation of crystallinity. Namely, the surface morphology is rough in the semiconductor layer formed on the photonic crystal layer, so as to give rise to many dislocations inside. When the side faces of holes include (110) and (-1-10) facets, a plurality of facets compete on the facets appearing at the initial stage of the regrowth embedding process (e.g., (113) and (-1-13), or (113)A planes), so as to result in heterogeneous regrowth in part. There is also a mechanism in which this region serves as nuclei for formation of dislocations.

On the other hand, in the present invention, the principal surface of the basic layer 6A is the (001) plane and the side faces of the holes H are surrounded by the {100} facets. Therefore, the aforementioned mechanism of formation of dislocations due to (110) and (-1-10) is suppressed and therefore the crystallinity is considered to become good.

Experiments were also conducted for a case where the shape of the holes H was circular.

Figure 14:
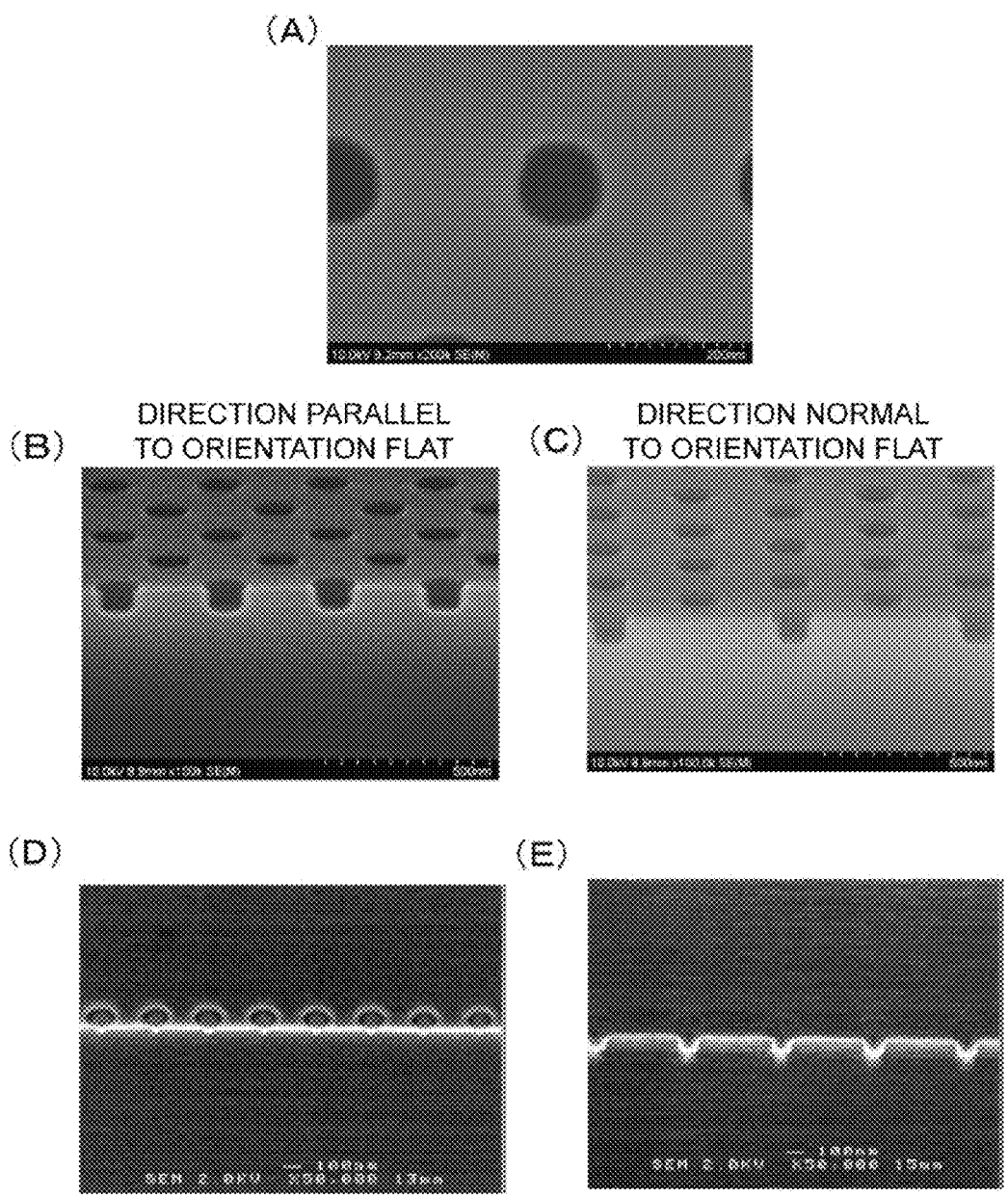
FIG. 14 is a drawing showing electron microscope photographs of the basic layer 6A with holes formed therein according to a second comparative example.

FIG. 14 is a drawing showing electron microscope photographs of the basic layer 6A where the holes according to a second comparative example are formed. The second comparative example is different only in the shape of the holes H from the first comparative example and is identical in the other. The opening diameter of the holes H is 120 nm.

FIG. 14(A) shows a planar photograph of the holes H and shows the circular holes H. FIG. 14(B) shows a sectional image of the basic layer (before formation of the embedded regions) cut along the direction parallel to the ori-fla and FIG. 14(C) a sectional image of the basic layer (before formation of the embedded regions) cut along the direction normal to the ori-fla. FIG. 14(D) shows a sectional image of the basic layer (after formation of the embedded regions) cut along the direction parallel to the ori-fla and FIG. 14(E) a sectional image of the basic layer (after formation of the embedded regions) cut along the direction normal to the ori-fla.

The embedding step is continued before formation of the upper cladding layer and thereafter the contact layer is formed. There are no large dislocations observed in these embedded regions and upper cladding layer (cf. FIG. 14(D) and FIG. 14(E)).

However, the morphology of the surface is worse.

Figure 15:
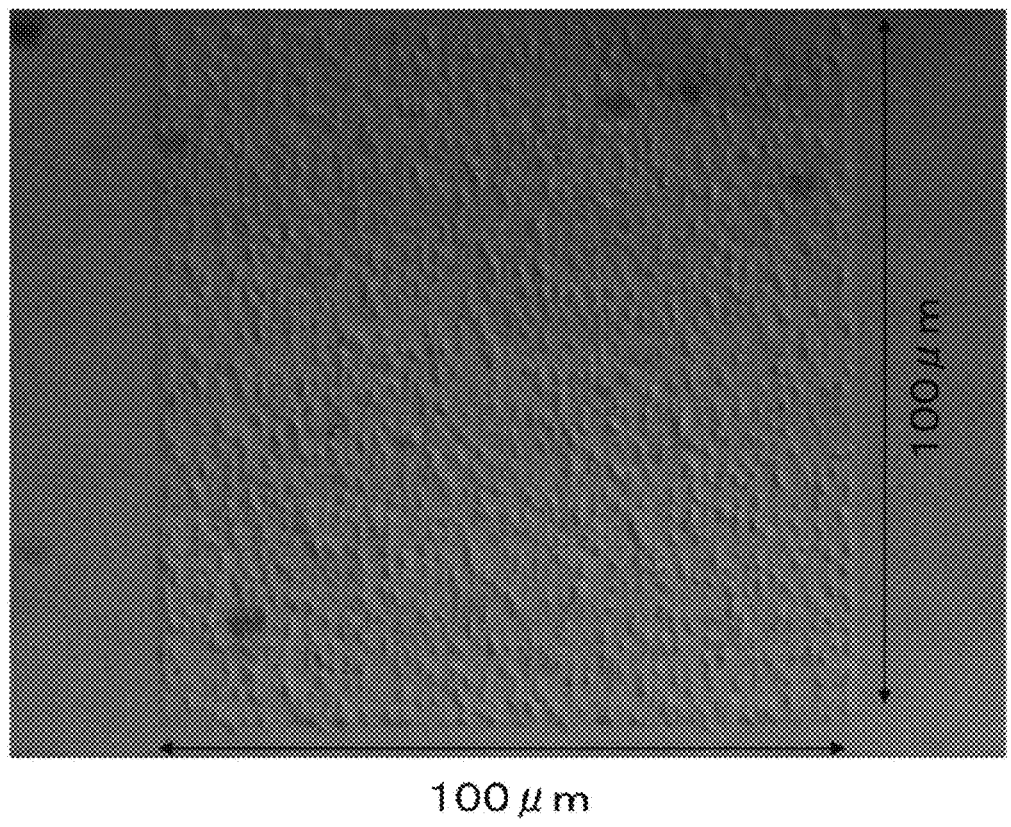
FIG. 15 is a drawing showing an optical microscope photograph of the surface of the semiconductor layer located on the outermost side of the semiconductor surface light-emitting element according to the second comparative example.
Figure 15:
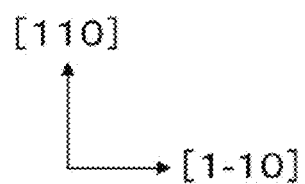

FIG. 15 is a drawing showing an optical microscope photograph of the surface of the semiconductor layer located on the outermost side of the semiconductor surface light-emitting element according to the second comparative example. The surface of the contact layer is rough to worsen the morphology, with many irregularities observed. The reason for it is that although there are no dislocations observed in the observation range of FIG. 14, there are dislocations observed in investigation over a wider range, so as to cause degradation of the surface morphology.

Next, we conducted research on a tolerance for angles of rotation of the hole by rotating the hole H according to the embodiment around the Z-axis passing the gravity center G thereof.

Figure 16:
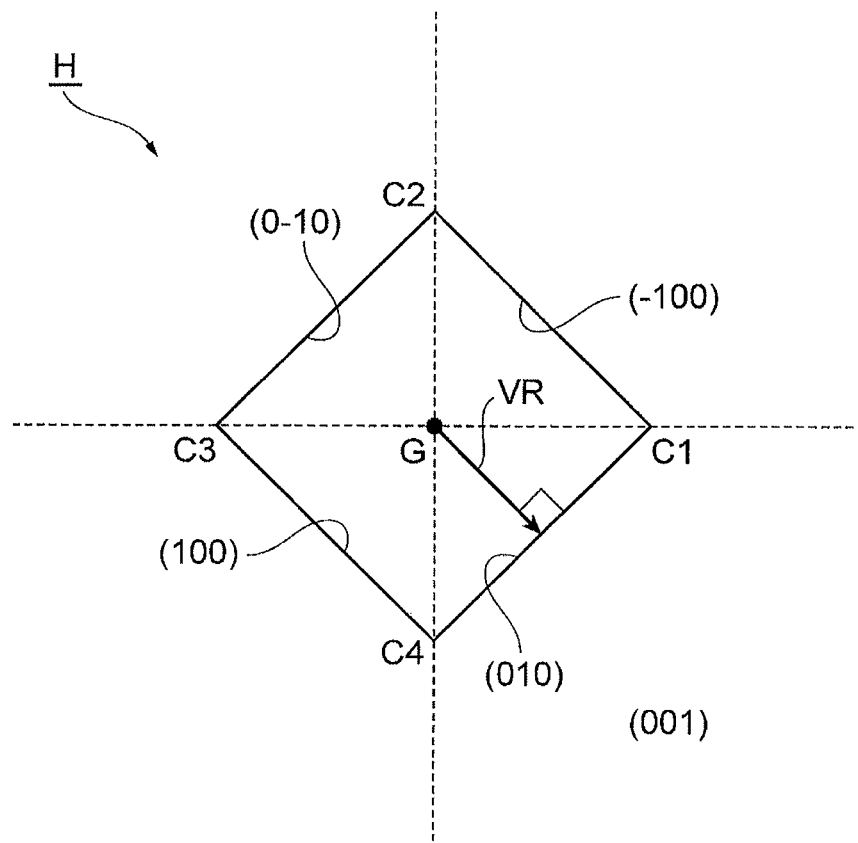
FIG. 16 is a drawing for explaining rotation of orientation of the hole.

FIG. 16 is a drawing for explaining the rotation of orientation of the hole.

A normal line is drawn from the gravity center G in the plane of the hole H to one side thereof, (010) facet, and an angle between this normal line VR and [0-10] is defined as rotation angle φ. Namely, the shape of the hole H is assumed to be a rectangle and the normal line VR is drawn to one side of the rectangle. If the shape of the hole H has some fluctuation, a rectangle circumscribed about it will be adopted as the shape of the hole H.

Figure 17:
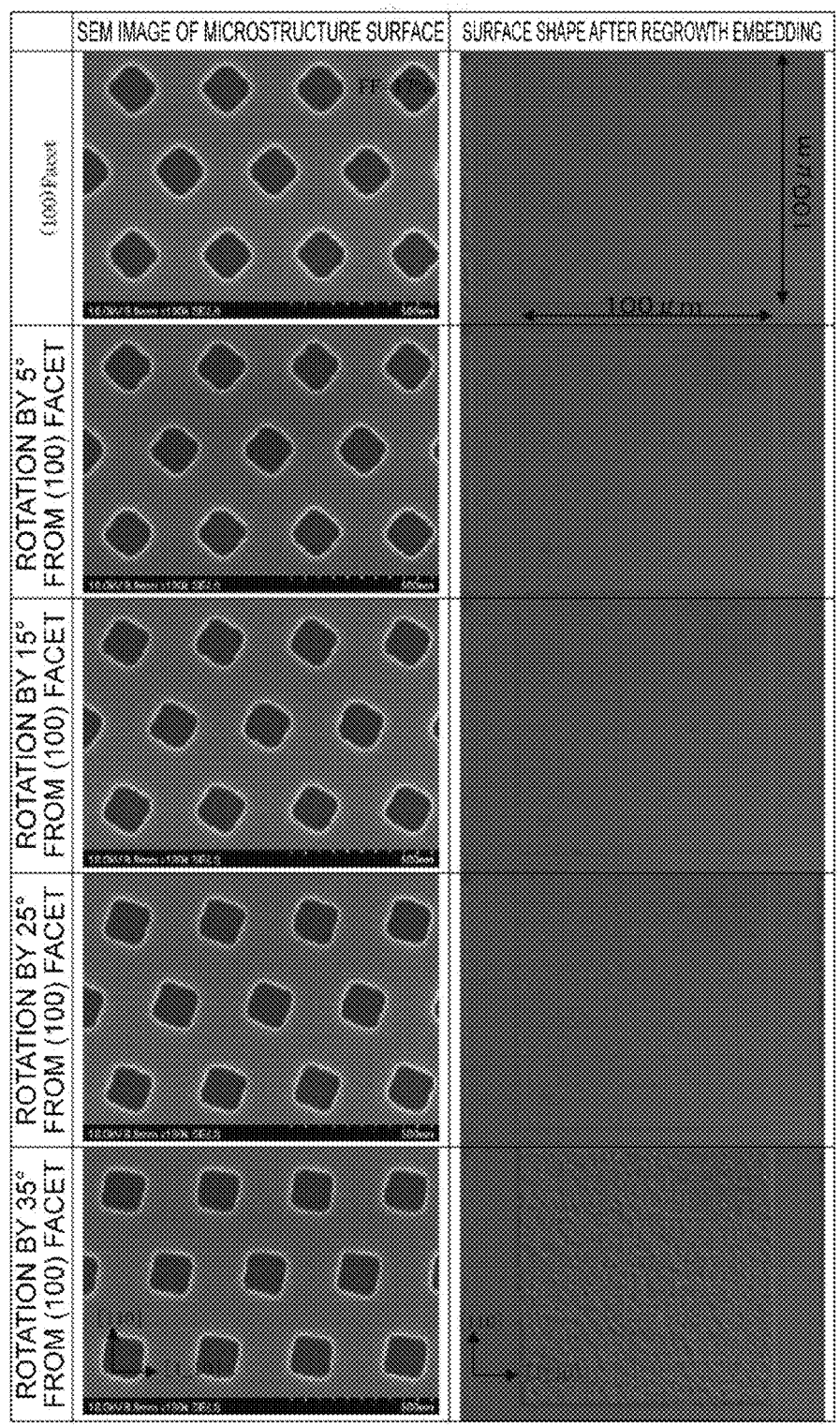
FIG. 17 is a drawing showing electron microscope photographs of the surface (on the left) of the basic layer with rotations of (100) side faces of the holes, and optical microscope photographs of the surface (on the right) of the semiconductor layer located on the outermost side of the semiconductor surface light-emitting element.

FIG. 17 is a drawing showing electron microscope photographs (on the left) of the surface of the basic layer with rotations of the (100) side face (facet) of each hole according to the example, and optical microscope photographs (on the right) of the surface of the semiconductor layer located on the outermost side of the semiconductor surface light-emitting element. The length of each side of the square holes is 140 nm, the intervals in the [1-10] direction of the gravity centers of the holes H are 335 nm, and the intervals in the [110] direction thereof are 580 nm. The surface morphology becomes degraded with the rotation angle φ being 35°, whereas the surface morphology is good with the rotation angle φ being smaller than it.

Figure 18:
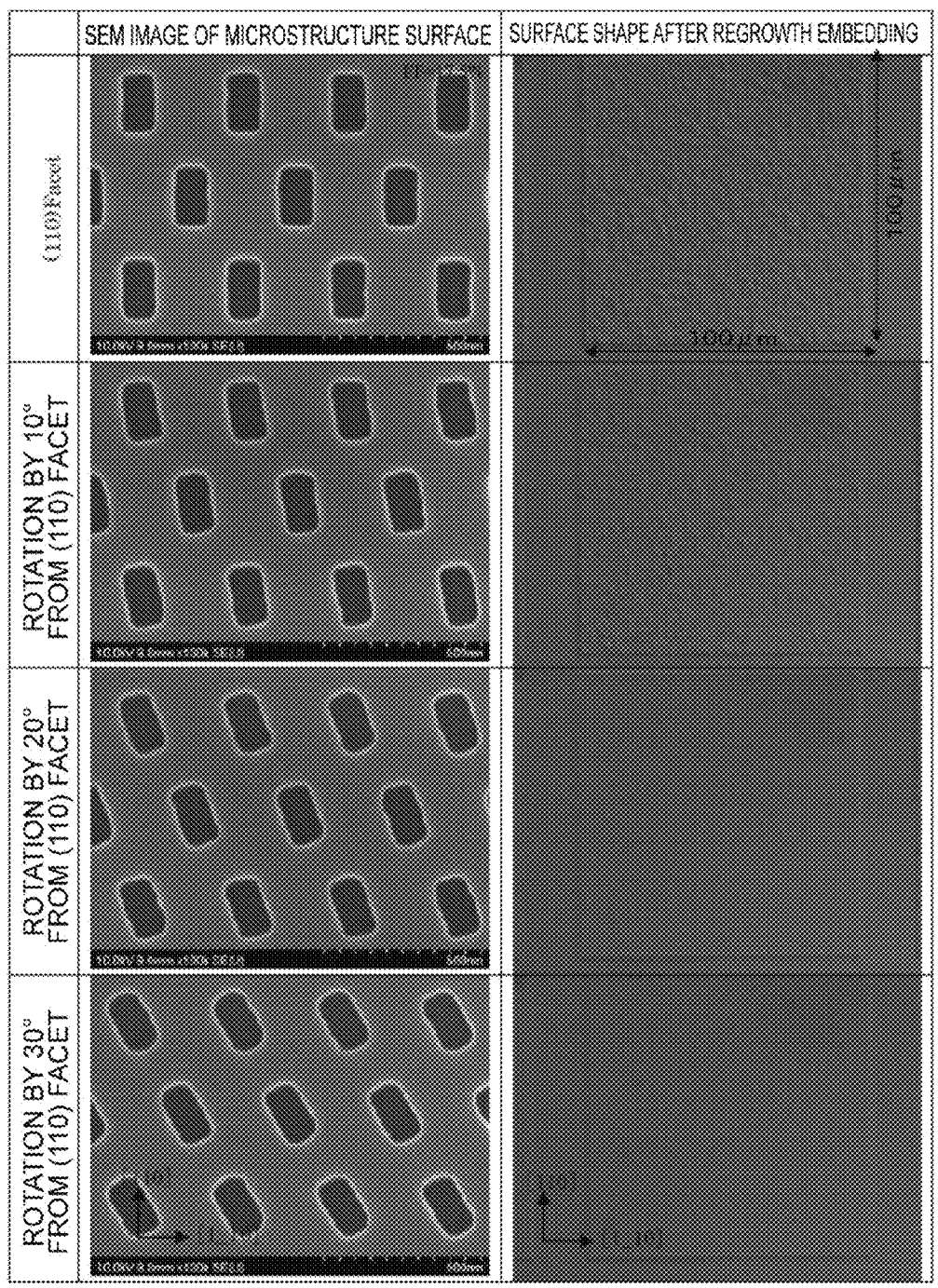
FIG. 18 is a drawing showing electron microscope photographs of the surface (on the left) of the basic layer with rotations of (110) side faces of the holes, and optical microscope photographs of the surface (on the right) of the semiconductor layer located on the outermost side of the semiconductor surface light-emitting element.

FIG. 18 is a drawing showing electron microscope photographs (on the left) of the surface of the basic layer with rotations of the (110) side face (facet) of each hole according to the first comparative example, and optical microscope photographs (on the right) of the surface of the semiconductor layer located on the outermost side of the semiconductor surface light-emitting element. The lengths of the respective sides of the rectangular holes are 100 nm and 200 nm, the intervals in the [1-10] direction of the gravity centers of the holes H are 335 nm, and the short sides are parallel to the [1-10] direction. The intervals in the [110] direction are 580 nm. The surface morphology becomes improved with the rotation angle φ over 20° (cf., the rotation angle of 25° in the example), whereas the surface morphology becomes worse with the rotation angle φ being smaller than it.

Figure 19:
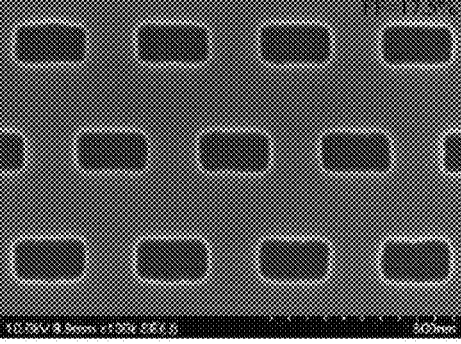
FIG. 19 is a drawing showing electron microscope photographs of the surface (on the left) of the basic layer with rotations of (110) side faces of the holes, and optical microscope photographs of the surface (on the right) of the semiconductor layer located on the outermost side of the semiconductor surface light-emitting element.

FIG. 19 is a drawing showing electron microscope photographs (on the left) of the surface of the basic layer with rotations of the (110) side face (facet) of each hole of the first comparative example, and optical microscope photographs (on the right) of the surface of the semiconductor layer located on the outermost side of the semiconductor surface light-emitting element. When compared to the case of FIG. 18, the long sides are parallel to the [1-10] direction. The surface morphology becomes improved with the rotation angle φ being not less than 20° (cf., the rotation angle φ being not more than 25° in the example), whereas the surface morphology becomes worse with the rotation angle γ being smaller than it.

Figure 20:
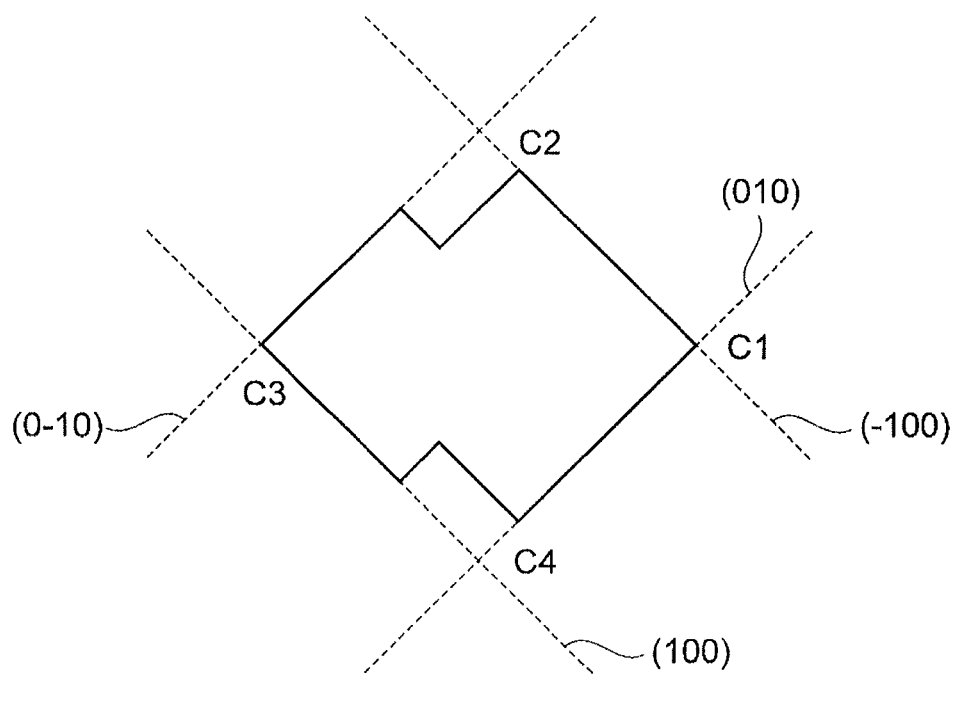
FIG. 20 is a drawing showing a shape of a hole in which corners are cut away in part.
Figure 20:
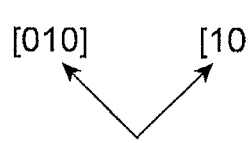
Figure 20:
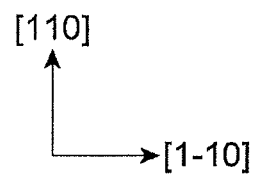

FIG. 20 is a drawing showing a shape of a hole H in which some corners C2, C4 are cut away in part, out of the four corners C1-C4. It is considered that the improvement effect of the crystallinity and surface morphology similar to the above is also achieved because the mechanism of formation of dislocations due to (110) and (-1-10) is suppressed.

The shape of the holes H was the rectangle in the above embodiment, but it may be a right-angled trapezium.

Figure 21:
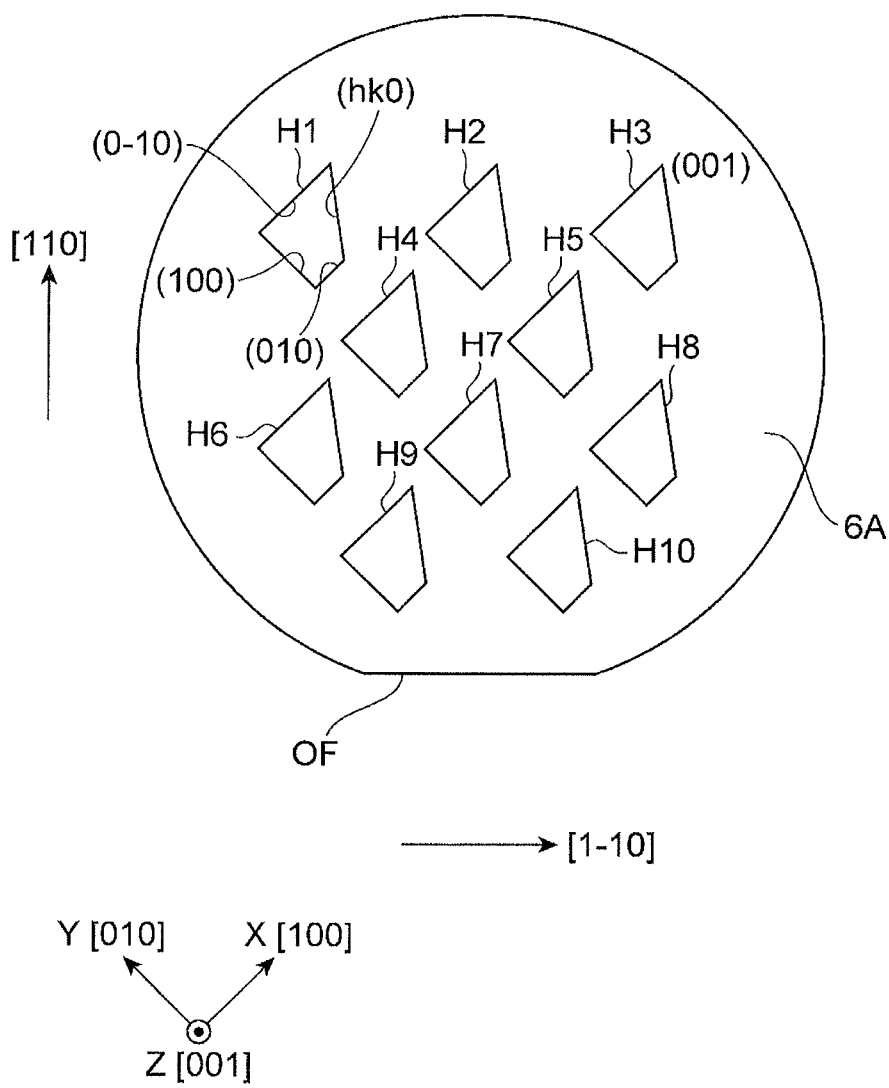
FIG. 21 is a plan view of the basic layer 6A formed on a wafer.

FIG. 21 is a plan view of the basic layer 6A formed on a wafer.

In the semiconductor surface light-emitting element of this embodiment, only the shape of the holes H is changed into a right-angled trapezium. The other structure is the same as that described above. The facets including the respective sides of the right-angled trapezium are (010), (0-10), (100), and (hk0). Namely, the three side faces belong to {100} facets.

Figure 22:
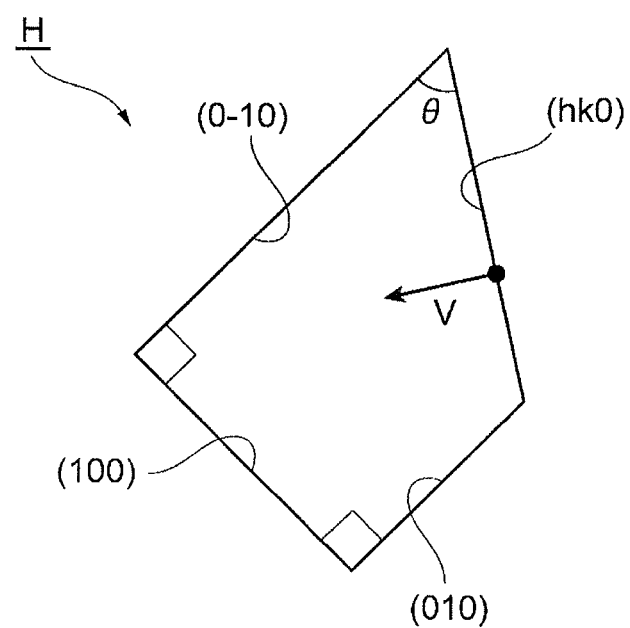
FIG. 22 is a drawing showing a shape of a hole.
Figure 22:
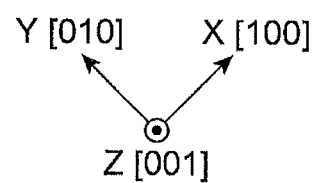

FIG. 22 is a drawing showing the shape of the hole H.

In this situation, an angle (acute angle) between the (010) plane and (hk0) plane is defined as θ. In FIG. 22 the plane orientation of the (hk0) plane is a plane orientation parallel to vector V[h1,k1,0], where h1=−sin θ and k1=cos θ. In the description hereinafter, FF represents Filling Factor. Filling Factor is an index to measure the size of the photonic crystal, and is a ratio of an area of the photonic crystal shape (the area of the hole H) to an area of a unit cycle of the two-dimensional structure. In the example below, the length a per unit cycle of the two-dimensional structure (lattice constant) is 335 nm.

Figure 23:
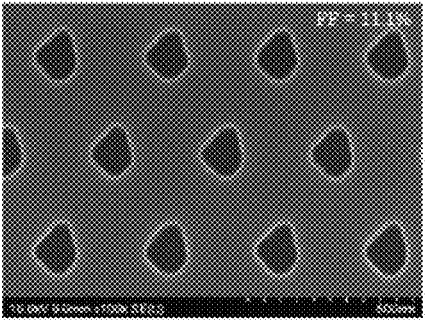
FIG. 23 is a drawing showing electron microscope photographs of the surface (on the left) of the basic layer with holes of a right-angled trapezium, and optical microscope photographs of the surface (on the right) of the semiconductor layer located on the outermost side of the semiconductor surface light-emitting element.

FIG. 23 is a drawing showing electron microscope photographs of the surface (on the left) of the basic layer 6A with the holes of the right-angled trapezium, and optical microscope photographs of the surface (on the right) of the semiconductor layer (contact layer) located on the outermost side of the semiconductor surface light-emitting element.

With θ being fixed at 60°, FF was changed from 11% to 33%, and the surface morphology was good in each case without any significant change.

Figure 24:
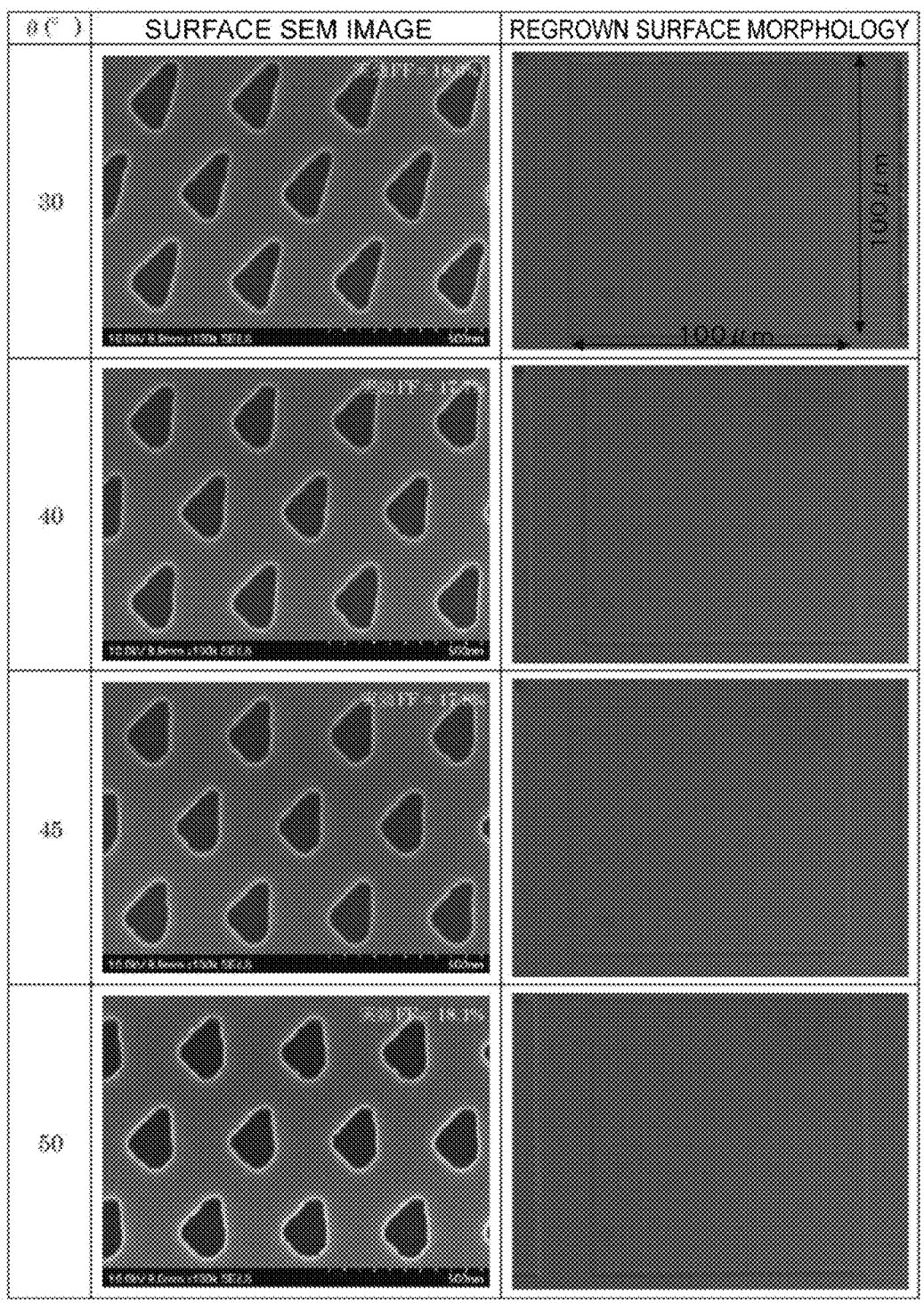
FIG. 24 is a drawing showing electron microscope photographs of the surface (on the left) of the basic layer with holes of a right-angled trapezium, and optical microscope photographs of the surface (on the right) of the semiconductor layer located on the outermost side of the semiconductor surface light-emitting element.
Figure 25:
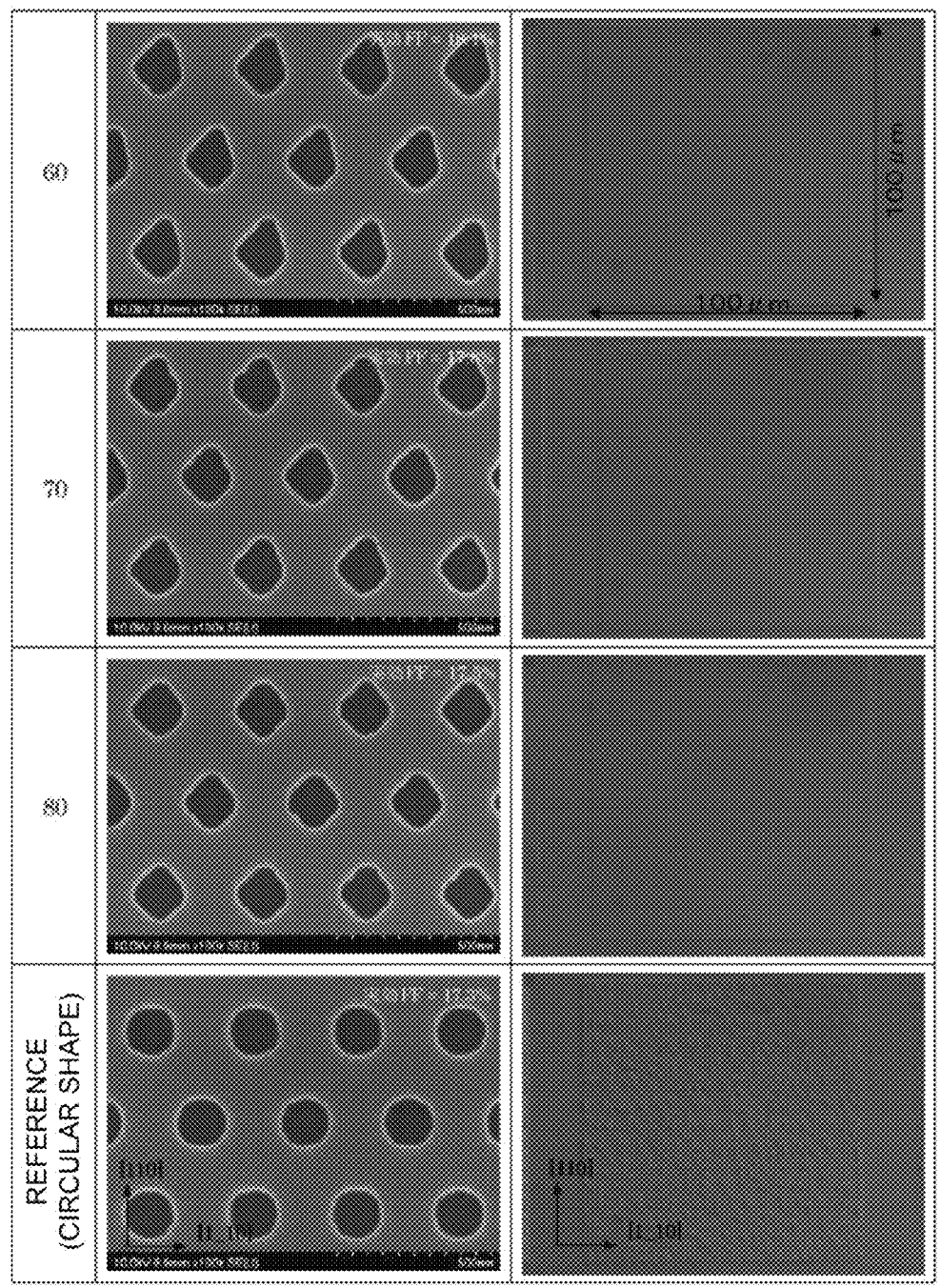
FIG. 25 is a drawing showing electron microscope photographs of the surface (on the left) of the basic layer with holes of a right-angled trapezium, and optical microscope photographs of the surface (on the right) of the semiconductor layer located on the outermost side of the semiconductor surface light-emitting element.

FIG. 24 and FIG. 25 are drawings showing electron microscope photographs of the surface (on the left) of the basic layer with the holes of the right-angled trapezium, and optical microscope photographs of the surface (on the right) of the semiconductor layer located on the outermost side of the semiconductor surface light-emitting element.

With FF being fixed at 15% (designed value), θ was changed from 30° to 80°, and the surface morphology was good in each case without any significant change.

Figure 26:
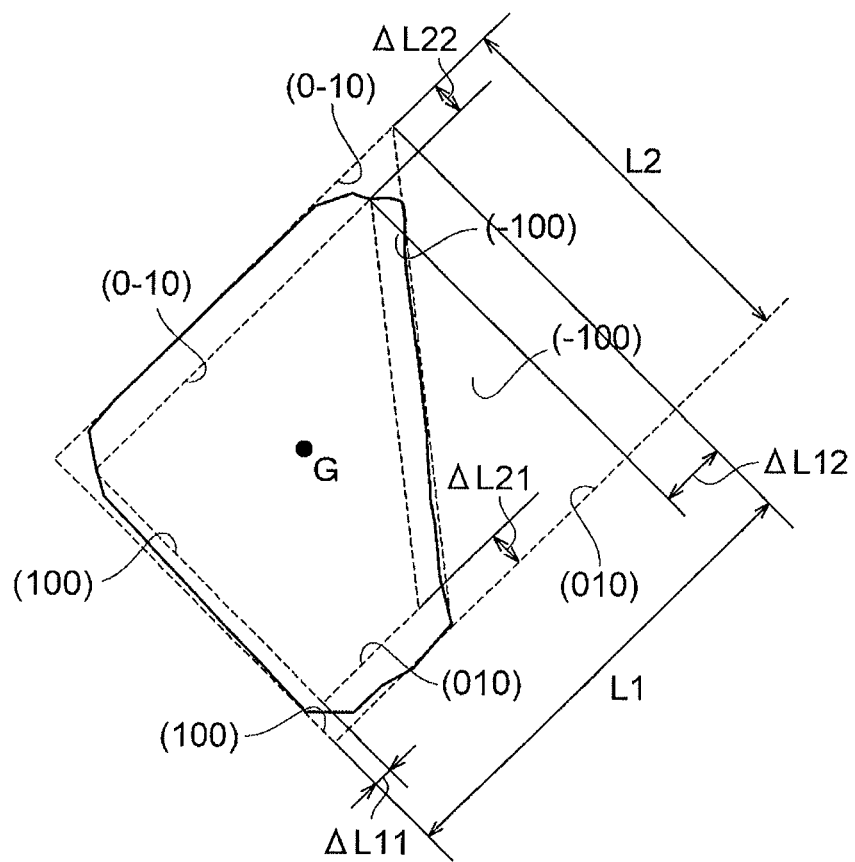
FIG. 26 is a drawing showing a detailed configuration of the shape of the hole.
Figure 26:
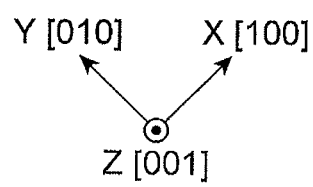

FIG. 26 is a drawing showing a detailed configuration of the shape of the hole.

In the XY plane, let us assume a right-angled trapezium circumscribed about the contour of the hole H, in which L1 represents the length of the longer of the upper base and the lower base and L2 the distance between the parallel sides opposed to each other. An inscribed right-angled trapezium similar to this right-angled trapezium is assumed with one corner in contact with the hole inside. The inscribed right-angled trapezium has the gravity center G in common with the circumscribed right-angled trapezium and their rotation positions in the XY plane are also assumed to equal. In this case, ΔL11 and ΔL12 represent separation distances in the direction parallel to the upper base of the trapezium between corresponding sides of the respective trapeziums and ΔL21 and ΔL22 separation distances in the direction of the height of the trapeziums.

When (ΔL11+ΔL12)/L1 is less than 29% and (ΔL21+ΔL22)/L2 is less than 29% and when a maximum of the area of the hole in the XY plane (the area of the outermost surface) is not less than 50% of the area of the right-angled trapezium circumscribed about it, the shape of the hole H is presumed as a right-angled trapezium and the side faces of the hole H are recognized as including three {100} facets.

Figure 27:
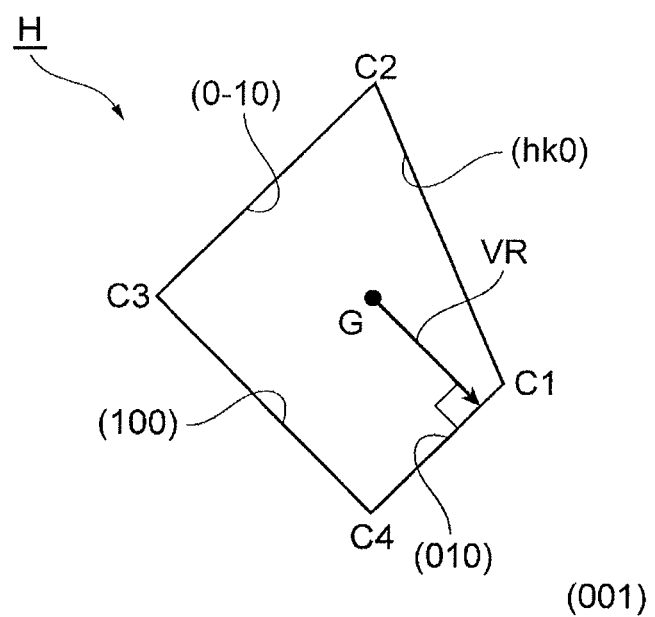
FIG. 27 is a drawing for explaining rotation of orientation of the hole.
Figure 27:
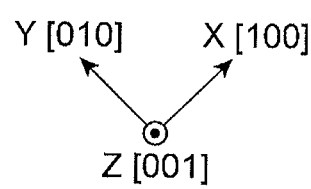
Figure 27:
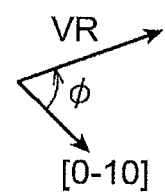

FIG. 27 is a drawing for explaining the rotation of orientation of the hole H in the case of the right-angled trapezium.

As in the case of the aforementioned rectangle, a normal line is drawn from the gravity center G in the plane of the hole H to one side of (010) facet thereof and an angle between this normal line VR and [0-10] is defined as rotation angle φ. Namely, a rectangle is assumed as the shape of the hole H and the normal line VR is drawn to one side thereof. If the shape of the hole H has some fluctuation, a rectangle circumscribed about it will be regarded as the shape of the hole H. In this case, a tolerance for the rotation angle φ with the result of good crystal is the same as in the case of the aforementioned rectangle. The reason for it is as follows: with the rotation angle φ over the tolerance, the {100} facets become closer to (110) and (-1-10) and thus the aforementioned mechanism of generation of dislocations functions, whereas in the case of the right-angled trapezium the main three {100} facets are common in comparison to the rectangle and therefore the mechanism of generation of dislocations is suppressed within the tolerance of the rotation angle φ.

Figure 28:
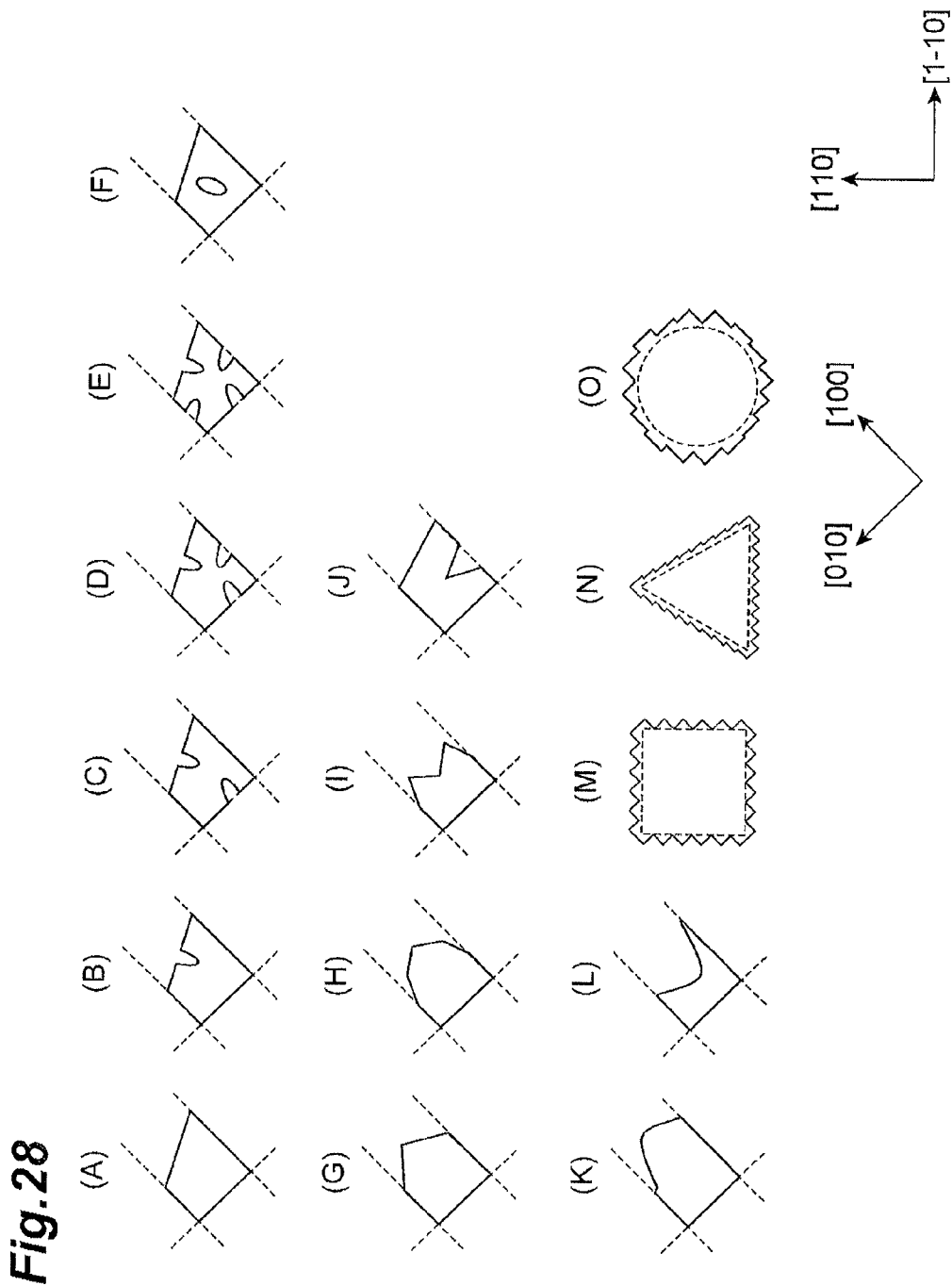
FIG. 28 is a drawing showing various shapes of holes.

FIG. 28 is a drawing showing various shapes of holes.

In the drawing dotted lines indicate {100} facets. FIG. 28(A) shows the shape in the aforementioned embodiment. (B) is a shape in which one side of (A) is notched in part so that a side face of the embedded region has a depression (depressed surface). (C) is a shape in which two sides of (A) are notched in part so that side faces of the embedded region have depressions (depressed surfaces). (D) is a shape in which three sides of (A) are notched in part so that side faces of the embedded region have depressions (depressed surfaces). (E) is a shape in which the four sides of (A) are notched in part so that the side faces of the embedded region have depressions (depressed surfaces). Each of the depressions shown in (B) to (E) may be replaced by a plurality of depressions or replaced by a projection. (F) is a case in which the center of the embedded region of (A) is notched in part. The notched region of (F) may be replaced by a plurality of notched regions.

It is considered that in these cases, the aforementioned effect is also achieved, for the reason of suppressing the foregoing mechanism of generation of dislocations due to (110) and (-1-10).

(G) is a case where the oblique side of the side face of the embedded region in (A) is a projection (projected surface) shape having two planes. (H) is a case where the side face of the embedded region in (A) is a projection (projected surface) shape in which a large number of planes are continuous. (I) is a case where the oblique side of the side face of the embedded region in (A) is a shape having two projections (projected surfaces). (J) is a case where one side of the side face of the embedded region in (A) is a shape having a depression (depressed surface) of a V-groove shape.

It is considered that in these cases, the aforementioned improvement effect of crystallinity and surface morphology is also achieved for the same reason as the suppression of the aforementioned dislocation generation mechanism.

(K) is a case where the oblique side of the side face of the embedded region in (A) is a projection (projected surface) shape consisting of a curve. (L) is a case where the oblique side of the side face of the embedded region in (A) is a depression (depressed surface) shape consisting of a curve. (M) shows an example of a shape in which each side has an uneven shape consisting of {100} facets with the length of one side being not less than 5 nm and a shape of an envelope connecting bottoms of depressions in the side faces is a rectangle. The shape of the envelope of the uneven shape composed of {100} facets was the rectangle in (M), but it may be any shape such as a triangle (N) or a circle (O).

It is considered that in these cases, the aforementioned improvement effect of crystallinity and surface morphology is also achieved for the same reason as the suppression of the aforementioned dislocation generation mechanism.

In the above embodiment, as described above, the side faces of each hole H include at least three different {100} facets, or facets resulting from rotation of these facets at the rotation angle of less than ±35° around the normal line to the principal surface. It is seen that when the shape of the side faces of the holes is determined as described above, the surface morphology of the semiconductor layer formed on the photonic crystal layer becomes extremely good and has high flatness, and the amount of dislocations generated inside is relatively reduced. Since such improvement in crystallinity of the semiconductor layer leads to improvement in resistance to temperature or heat, the lifetime can increase and the leak current and internal resistance will decrease, thus enabling improvement in luminous efficiency. Namely, when the shape of the holes is the one in the aforementioned embodiment, the properties of the semiconductor surface light-emitting element can improve.

Particularly, when the side faces of the holes include four different {100} facets as in the embodiment shown in FIGS. 1 to 9, or when the side faces of the holes include facets resulting from rotation of these facets at the rotation angle of less than ±35° around the normal line to the principal surface as in the embodiment shown in FIGS. 16 to 19, the surface morphology of the semiconductor layer formed on the photonic crystal layer is extremely good and has high flatness, so as to improve the properties of the semiconductor surface light-emitting element.

The surface morphology is much more improved in the case of the rotation angle φ being not more than ±25° than in the case of 35°, with the result of improvement in crystallinity of the semiconductor layer. The surface morphology is further improved in the case of the rotation angle φ being not more than ±20° than in the case of 25°, with the result of improvement in crystallinity of the semiconductor layer.

The aforementioned first compound semiconductor is GaAs and the second compound semiconductor AlGaAs. When these compound semiconductors of the zinc blende structure are employed, their material properties are well known and the formation thereof is easy.

Figure 29:
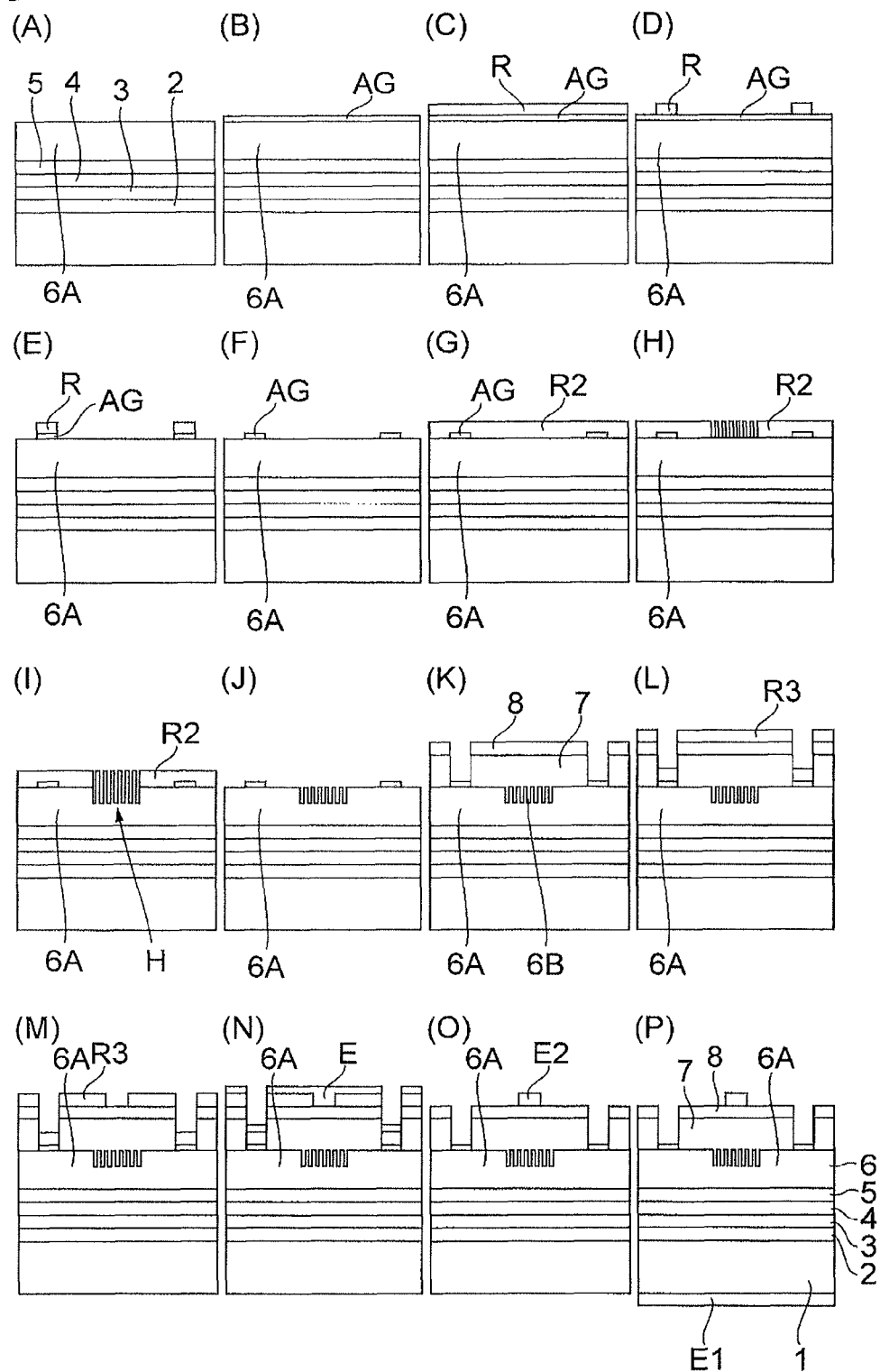
FIG. 29 is a drawing for explaining a first manufacturing method of photonic crystal layer.

FIG. 29 is a drawing for explaining a first manufacturing method of the photonic crystal layer.

On the n-type (referred to as first conductivity type) semiconductor substrate (GaAs) 1, the n-type cladding layer (AlGaAs) 2, guiding layer (AlGaAs) 3, multiple quantum well structure (InGaAs/AlGaAs) 4, light guiding layer (GaAs/AlGaAs) or spacer layer (AlGaAs) 5, and basic layer (GaAs) 6A to become the photonic crystal layer, are epitaxially grown in order by the MOCVD (metal-organic chemical vapor deposition) process.

For alignment after the epitaxial growth, an SiN layer AG is formed on the basic layer 6A by the PCVD (plasma CVD) process (B), and then a resist R is formed on the SiN layer AG (C). Furthermore, the resist R is exposed and developed (D) and the SiN layer AG is etched using the resist R as a mask to form alignment marks, while leaving the SiN layer AG in part (E). The remaining resist is removed (F).

Next, a resist R2 is applied onto the basic layer 6A and a two-dimensional microscopic pattern is scribed on the resist R2 with an electron beam scriber and developed to form the two-dimensional microscopic pattern on the resist R2 (H). Thereafter, dry etching is carried out using the resist R2 as a mask to transfer the two-dimensional microscopic pattern in the depth of about 100 nm onto the basic layer 6A (to form the holes H) (I), and then the resist is removed (J). The depth of the holes H is 100 nm.

Thereafter, regrowth is carried out by the MOCVD process.

In the regrowth step the embedded regions (AlGaAs) 6B are grown in the holes H and then the p-type cladding layer (AlGaAs) 7 and p-type contact layer (GaAs) 8 are successively epitaxially grown thereon (K). Next, a resist R3 with square holes H is formed on the p-type contact 8 (L), the resist R3 is patterned (M), the electrode E is evaporated from over the resist R3 (N), and the electrode material is removed by the lift-off process while leaving only the electrode (Cr/Au) E2 (O). Then the back surface of the n-type semiconductor substrate 1 is polished and an n-type electrode (AuGe/Au) E1 is formed thereon (P).

Figure 30:
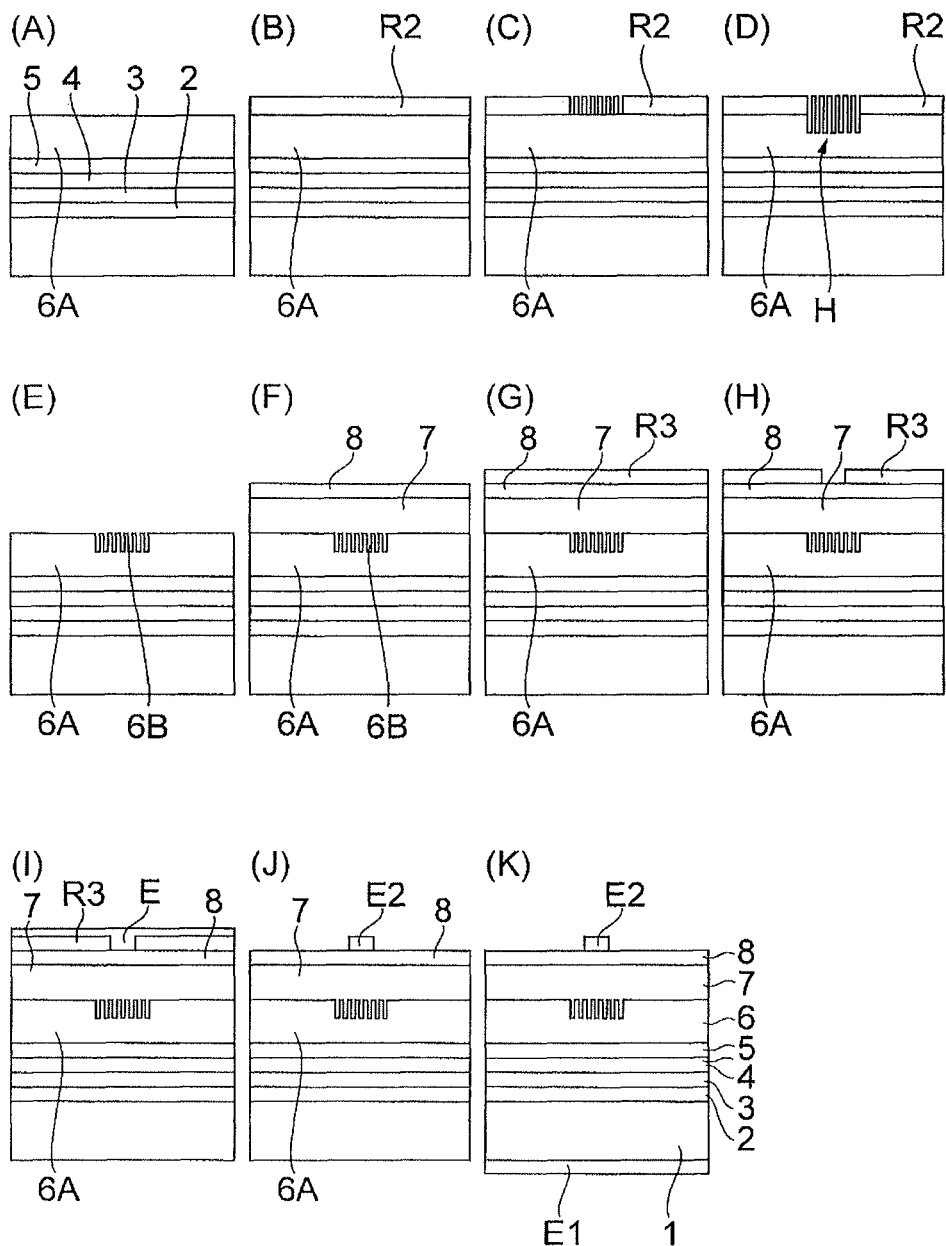
FIG. 30 is a drawing for explaining a second manufacturing method of photonic crystal layer.

FIG. 30 is a drawing for explaining a second manufacturing method of the photonic crystal layer.

On the n-type (first conductivity type) semiconductor substrate (GaAs) 1, the n-type cladding layer (AlGaAs) 2, guiding layer (AlGaAs) 3, multiple quantum well structure (InGaAs/AlGaAs) 4, light guiding layer (GaAs/AlGaAs) or spacer layer (AlGaAs) 5, and basic layer (GaAs) 6A to become the photonic crystal layer, are successively epitaxially grown by the MOCVD (metal-organic chemical vapor deposition) process.

Next, the resist R2 is applied onto the basic layer 6A (B) and a two-dimensional microscopic pattern is scribed with an electron beam scriber and developed to form the two-dimensional microscopic pattern on the resist (C). At this time, squares with each side of 120 nm surrounded by (110) facets are arranged at intervals of 330 nm at alignment mark positions of a photomask used, and the area of the entire region is set to 100 μm×100 μm. As described below, this pattern is used as a reference for registration in optical exposure after the regrowth.

Thereafter, dry etching is carried out to transfer the two-dimensional microscopic pattern in the depth of about 100 nm onto the basic layer 6A (D) and the resist is removed (E). Since the positions of the marks are also etched, a pattern (of alignment marks) is formed at the positions. This pattern has side faces surrounded by four {110} facets, which may be slightly rotated (within ±10°). Since this pattern has dislocations formed by regrowth as well, the surface after the regrowth becomes rough. Therefore, the rough surface can be used as a reference for registration in optical exposure after the regrowth. Thereafter, the regrowth is carried out by the MOCVD process. In this manner, prior to the step of carrying out the regrowth of the embedded regions, the alignment marks with the {110} facets or with the facets resulting from rotation of {110} at the rotation angle of within ±10° around the normal line to the principal surface (001) are formed at the appropriate locations (in an outside region off a region where the light-emitting element is intended to be formed) on the semiconductor substrate on which the basic layer 6A is formed, by etching, which can eliminate a need for an ordinary alignment mark forming step.

In the regrowth step the embedded regions (AlGaAs) 6B are grown in the holes H and thereafter, the p-type cladding layer (AlGaAs) 7 and p-type contact layer (GaAs) 8 are successively epitaxially grown (F). Next, the resist R3 with square holes H is formed on the p-type contact 8 (G), the resist R3 is patterned by optical exposure (H), the electrode E is evaporated from over the resist R3 (I), and the electrode material is removed by the lift-off process while leaving only the electrode (Cr/Au) E2 (J). Then the back surface of the n-type semiconductor substrate 1 is polished and the n-type electrode (AuGe/Au) E1 is formed thereon (K).

In this method, the pattern surrounded by {110} facets is formed before the regrowth in the process of forming the aforementioned element, and the pattern can be used as a reference position for registration in optical exposure after the regrowth.

The depth of the holes H may be smaller than the thickness of the basic layer 6A or may be slightly larger than it. Furthermore, the (001) wafer may be an off substrate.

The production method of the holes H in the embodiments was the production process by the electron beam exposure method, but other microfabrication technology may be employed, e.g., nanoimprint, interference exposure, FIB, or optical exposure with a stepper or the like.

LIST OF REFERENCE SIGNS 6A basic layer; 6B embedded regions; H holes.

The invention claimed is:
1. A photonic crystal surface light-emitting laser comprising:
a semiconductor substrate;
a lower cladding layer provided on the semiconductor substrate;
a lower light guiding layer provided on the lower cladding layer;
an active layer provided on the lower light guiding layer;
an upper light guiding layer provided on the active layer;

a photonic crystal layer provided on the upper light guiding layer;

an upper cladding layer provided on the photonic crystal layer; and a contact layer provided on the upper cladding layer;

an upper electrode in contact with the contact layer; and a lower electrode in contact with the semiconductor substrate;

wherein the photonic crystal layer is obtained by periodically forming a plurality of holes in a basic layer comprised of a first compound semiconductor of a zinc blende structure and growing embedded layers comprised of a second compound semiconductor of the zinc blende structure, in the holes; and wherein the active layer supplies light to the photonic crystal layer, wherein a principal surface of the basic layer is a (001) plane, and wherein side faces of the holes include at least three different {100} facets, or facets resulting from rotation of said {100} facets at a rotation angle of less than ±35° around a normal line to the principal surface.

2. The photonic crystal surface light-emitting laser according to claim 1, wherein the side faces of the holes include four different {100} facets, or facets resulting from rotation of said {100} facets at a rotation angle of less than ±35° around the normal line to the principal surface.

3. The photonic crystal surface light-emitting laser according to claim 1, wherein the rotation angle is set to not more than ±25°.

4. The photonic crystal surface light-emitting laser according to claim 1, wherein the rotation angle is set to not more than ±20°.

5. The photonic crystal surface light-emitting laser according to claim 1, wherein the first compound semiconductor is GaAs, and wherein the second compound semiconductor is AlGaAs.

6. A manufacturing method for manufacturing the photonic crystal surface light-emitting laser as defined in claim 1, comprising:

a step of forming the holes; and a step of carrying out growth of the embedded layers.

7. The manufacturing method of the photonic crystal surface light-emitting laser according to claim 6, comprising:

a step of forming an alignment mark including {110} facets, or facets resulting from rotation of {110} at a rotation angle of within ±10° around the normal line to the principal surface, on a semiconductor substrate on which the basic layer is formed, by etching, prior to the step of carrying out the growth.

8. The photonic crystal surface light-emitting laser according to claim 1, wherein the lower cladding layer is in contact with the semiconductor substrate;

the lower light guiding layer is in contact with the lower cladding layer; and the active layer is in contact with the lower light guiding layer.

* * * * *